(12) United States Patent
Itani et al.

(10) Patent No.: US 7,536,399 B2
(45) Date of Patent: May 19, 2009

(54) DATA COMPRESSION METHOD, PROGRAM, AND APPARATUS TO ALLOW CODING BY DETECTING A REPETITION OF A MATCHING CHARACTER STRING

(75) Inventors: Noriko Itani, Kawasaki (JP); Takahiro Nomiyama, Tokyo (JP)

(73) Assignee: Fujitsu Limited, Kawasaki (JP)

( * ) Notice: Subject to any disclaimer, the term of this patent is extended or adjusted under 35 U.S.C. 154(b) by 573 days.

(21) Appl. No.: 11/166,146

(22) Filed: Jun. 27, 2005

(65) Prior Publication Data
US 2005/0283355 A1    Dec. 22, 2005

Related U.S. Application Data

(63) Continuation of application No. PCT/JP02/13600, filed on Dec. 26, 2002.

(51) Int. Cl.
*G06F 17/30* (2006.01)
(52) U.S. Cl. .................. 707/101; 711/141; 715/229
(58) Field of Classification Search ................ 707/101, 707/6
See application file for complete search history.

(56) References Cited

U.S. PATENT DOCUMENTS 5,126,739 A * 6/1992 Whiting et al. ............. 341/106
5,532,693 A * 7/1996 Winters et al. .............. 341/51
5,883,588 A    3/1999 Okamura
5,936,560 A    8/1999 Higuchi

FOREIGN PATENT DOCUMENTS

| JP | 09-046235   | 2/1997 |
| JP | 09-153818   | 6/1997 |
| JP | 2000-082967 | 3/2000 |

OTHER PUBLICATIONS

International Search Report for corresponding Appln. No. PCT/JP02/13600 dated Apr. 22, 2003.

* cited by examiner

*Primary Examiner*—John R. Cottingham
*Assistant Examiner*—Noosha Arjomandi
(74) *Attorney, Agent, or Firm*—Staas & Halsey LLP

(57) ABSTRACT

Providing a data compression method, program, and apparatus that allows coding by detecting a repetition of a matching character string even without successiveness of the same numbers in a recent match position list. Using a recent match position list for narrowing down candidates for a matching character string that have previously appeared and to perform detection and coding of a matching character string by performing comparison with each character string in the input buffer as a candidate.

15 Claims, 18 Drawing Sheets

FIG. 5A

INPUT BUFFER 212

| ADDRESS | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 | 32 | 33 | 34 |
|---|---|---|---|---|---|---|---|---|---|---|---|---|---|---|---|---|---|---|---|---|---|---|---|---|---|---|---|---|---|---|---|---|---|---|
| | c | o | m | p | r | e | s | s | i | o | n | | d | e | c | o | m | p | r | e | s | s | i | o | n | | c | o | m | p | r | e | s | s | i | o | n |

SORT ADDRESSES WITH THREE-CHARACTER STRING STARTING AT EACH ADDRESS

FIG. 5B

RANK LIST 214

| _de | _co | com | com | com | dec | eco | ess | ess | ess | ion | pre | pre | pre | res | res | res | s_c | sio | sio | ss_ | ssi | ssi |
|---|---|---|---|---|---|---|---|---|---|---|---|---|---|---|---|---|---|---|---|---|---|---|
| 23 | 12 | 1 | 15 | 24 | 13 | 14 | 6 | 20 | 29 | 9 | 4 | 18 | 27 | 5 | 19 | 28 | 22 | 8 | 31 | 21 | 7 | 30 |

FOR ADDRESS 15, RECENTLY-APPEARING "COM" IS AT ADDRESS 1, RELATIVE POSITION 14

FOR ADDRESS 27, RECENTLY-APPEARING "pre" IS AT ADDRESS 18, RELATIVE POSITION 9

CONVERSION

FIG. 5C

RECENT MATCH POSITION LIST 216

| 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 | 32 | 33 | 34 |
|---|---|---|---|---|---|---|---|---|---|---|---|---|---|---|---|---|---|---|---|---|---|---|---|---|---|---|---|---|---|---|---|---|---|
| 0 | 0 | 0 | 0 | 0 | 0 | 0 | 0 | 0 | 0 | 0 | 0 | 0 | 0 | 14 | 14 | 14 | 14 | 0 | 0 | 0 | 0 | 0 | 0 | 0 | 0 | 9 | 9 | 9 | 9 | 0 | 0 | 0 | 0 |

FIG. 5D

RECENT MATCH POSITION LIST 216

| 0 | 0 | 0 | 0 | 0 | 0 | 0 | 0 | 0 | 0 | 0 | 0 | 0 | 0 | 14 | 14 | 14 | 14 | 0 | 0 | 0 | 0 | 0 | 0 | 0 | 0 | 9 | 9 | 9 | 9 | 23 | 23 | 23 | 0 |

MATCH LENGTH 6+2=8, MATCH POSITION 14

MATCH LENGTH 9+2=11, MATCH POSITION 23

INPUT BUFFER 212

RECENT MATCH POSITION LIST 216

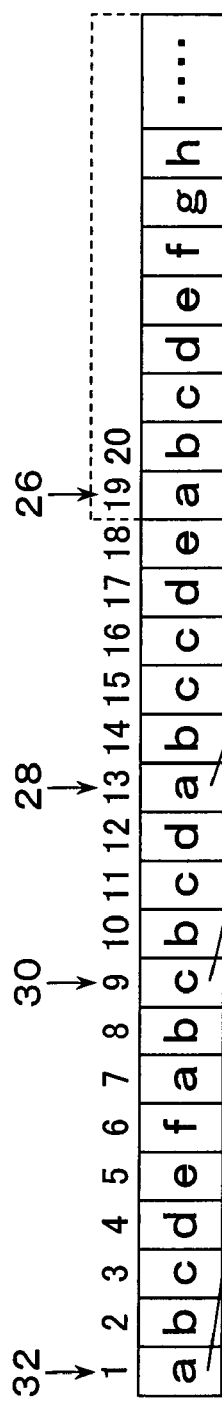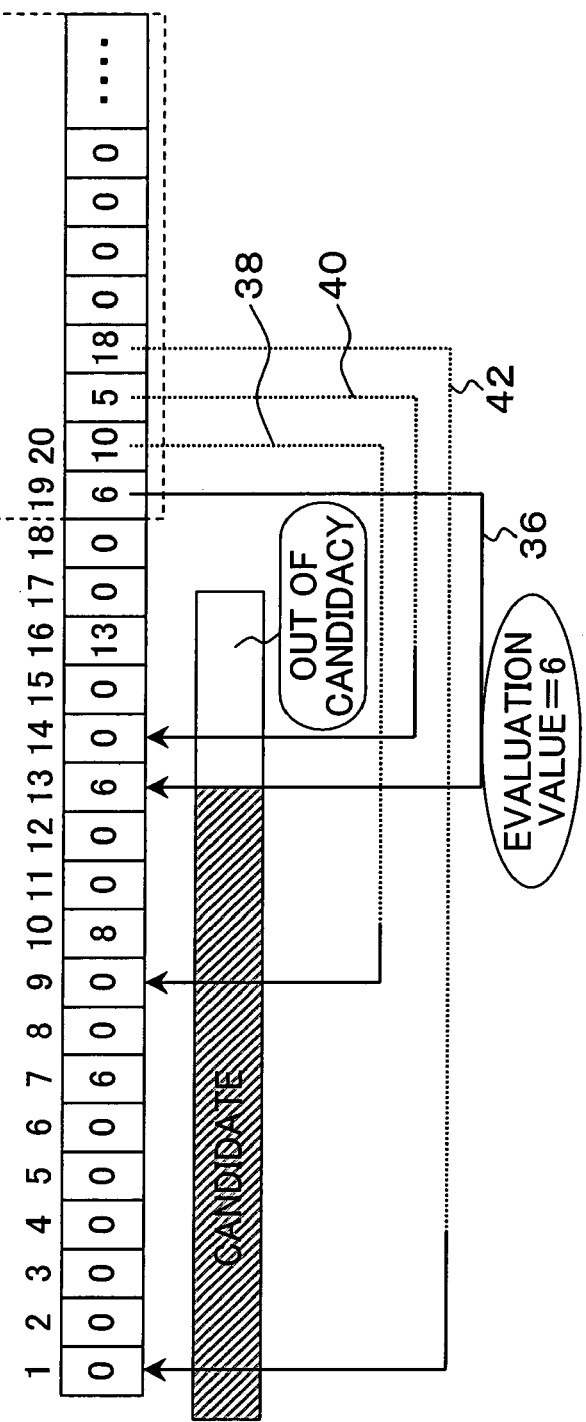

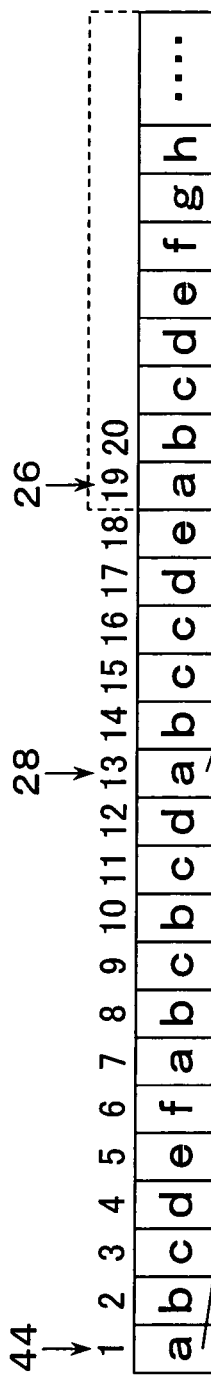
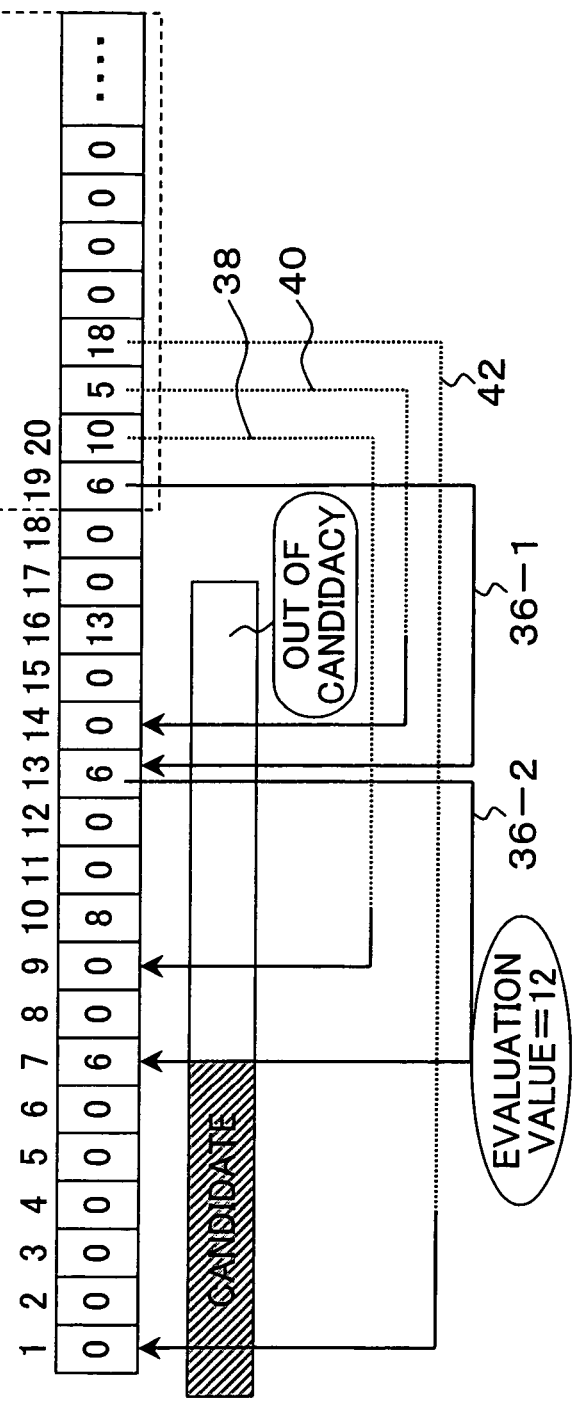
FIG. 12A INPUT BUFFER 12
FIG. 12B RECENT MATCH POSITION LIST 24

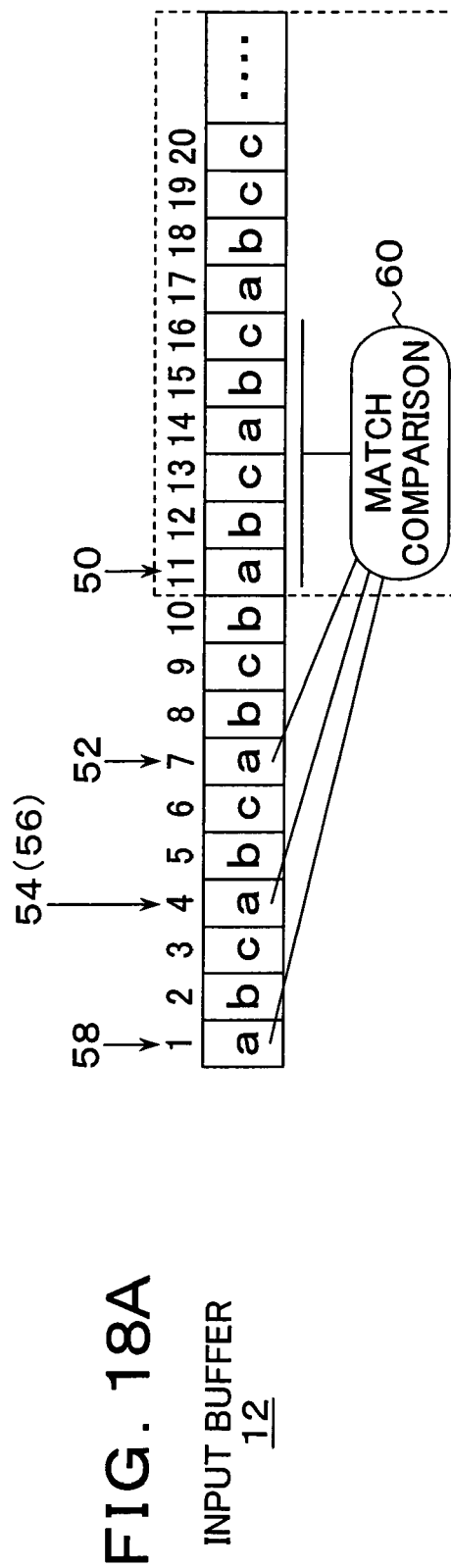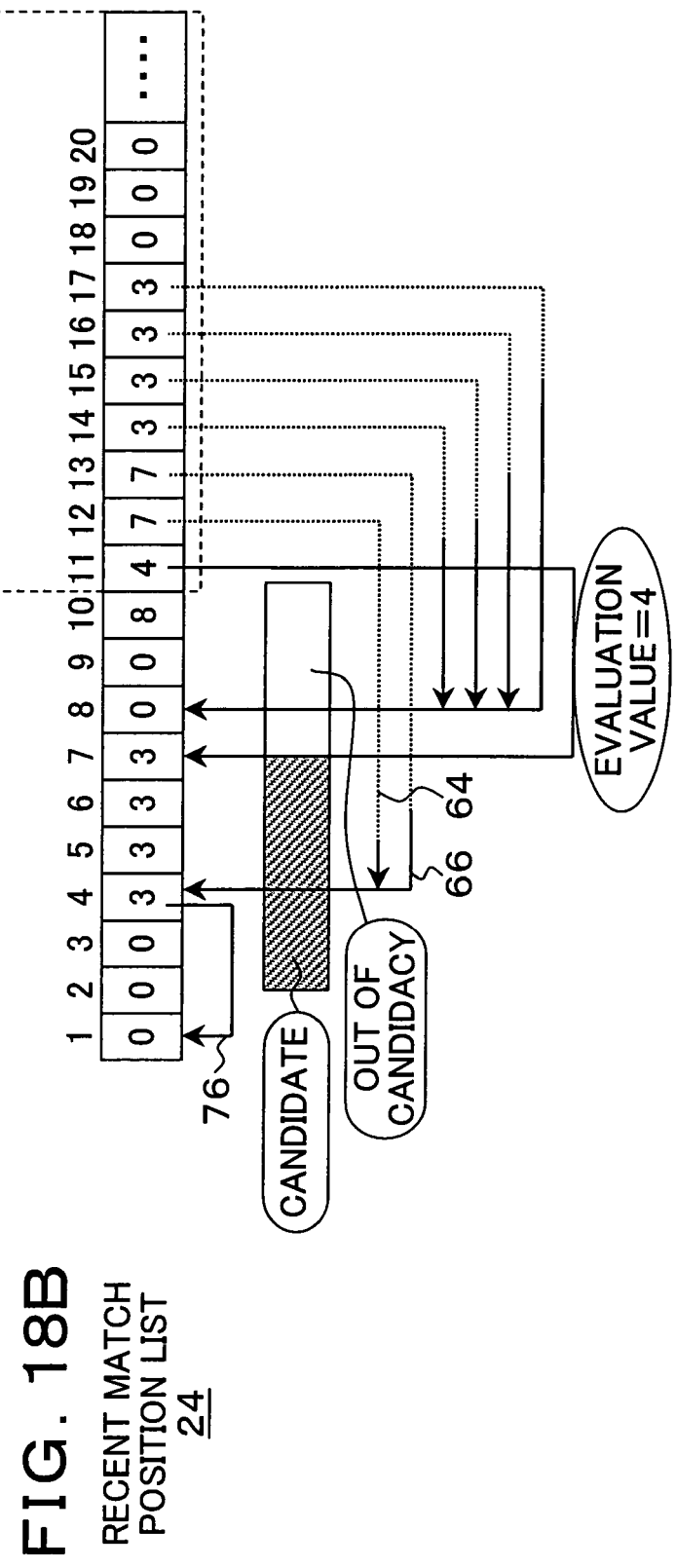
FIG. 18A
INPUT BUFFER
12
FIG. 18B
RECENT MATCH POSITION LIST
24

DATA COMPRESSION METHOD, PROGRAM, AND APPARATUS TO ALLOW CODING BY DETECTING A REPETITION OF A MATCHING CHARACTER STRING

This application is a continuation of PCT/JP02/13600, filed Dec. 26, 2002.

TECHNICAL FIELD

The present invention relates to a data compression method, program, and apparatus that generates compressed data from a data string to be compressed and, particularly, to a data compression method, program, and apparatus that uses a dictionary generated from a data string to be compressed to compress the data string.

BACKGROUND ART

In recent years, with various types of data, such as character code and image data, being handled by computers, the amount of data to be handled has been increasing. When such a large amount of data is handled, compression is performed with a redundant portion in the data being omitted, thereby allowing a reduction in capacity of storage required and high-speed transmission to a remote place.

Here, the present invention can be applied not only to compression of a character code but also to compression of various data. In the following description, based on the information theory, data of one word obtained by dividing a data string in units of words is referred to as a character, and a data string having an arbitrary number of words is referred to as a character string.

Conventional data compression technologies include dictionary coding using similarity of data series and statistical coding using a frequency of appearance of a data string. Of these, as typical schemes of the former dictionary coding, LZ77 coding and LZ78 coding have been known (Tomohiko Uematsu, "An introduction to document data compression algorithm", CQ Publishing, pp. 131-208, 1995).

By comparison between LZ77 coding and LZ78 coding, LZ77 coding can achieve a sufficient compression ratio with a simple process, and therefore has become mainstream in practical use.

In LZ77 coding, as shown in FIG. 1, a slide buffer 200 having a certain size is provided. In this buffer 200, a character string having the longest match with an input character string is searched for, and with the use of the position and length of the character string, the input character string is coded. Since the buffer 200 is slid as coding proceeds, this coding scheme is also called a slide dictionary scheme. In FIG. 1, when an input character string "abcdaaaq" at the right of the buffer 200 is coded, the longest character string that matches therewith in the buffer 200 is "abcd". Thus, with a relative address "5 (bytes)" between the head position of the longest-match character string and the head position of the input character string being taken as a match position and the length of the longest-match character string "4 (bytes)" being taken as a match length, a code, such as (match position, match length)=(5, 4), is generated. With this, the head "abcd" of the input character string is replaced by (5, 4). Similarly, the next character string "aaa" is replaced by (13, 3). However, the slide buffer in practical use is much longer, and when character strings in the buffer are sequentially searched in order to find a character string that has a longest match, an enormous amount of time is required. Therefore, in practice, in stead of checking all character strings in the buffer, a position where a prefix unit (the order of two to four characters) of a character string is registered in a table as required, and only the characters string whose positions are retained in the table are checked. Examples of the table for use in such a search include a Look Up Table (LUT) and a Hash Table.

FIG. 2 shows a character string search using a LUT. A LUT 202 has stored therein a position (address or pointer) of appearance of a character string in the buffer 200 with a prefix unit of the character strings in the buffer 200 being taken as an address. At the time of a search, with a prefix unit of the input character string being taken as an address, an area of the LUT 202 is accessed, thereby acquiring a position of the corresponding character string. If plural character strings having the same prefix unit are present in the buffer 100, as shown in FIG. 3, plural positions of appearance are retained in a form of a linked list 204. Thus, by accessing the LUT 202 only once, the positions of all corresponding character strings in the buffer 200 can be acquired. Here, a prefix unit of two characters is used, and an area of the LUT 202 corresponding to the prefix unit "ab" of the input character string retains two positions of appearance by using the linked list 204.

As such, in the LUT, the prefix unit to be searched for is caused to have a one-to-one correspondence with the area of the table, and referring to the table only once achieves an acquisition of necessary information, thereby allowing an extremely high-speed search. However, when a long character string is searched for, the number of required areas in the table is increased with a power of the width of the number of characters that can appear, thereby requiring an enormous amount of areas. For example, when the number of characters that can appear is 256 of 8 bits, the number of areas required for prefix units of n characters is the n-th power of 256. However, if the prefix unit to be searched for is made longer, only a part of the areas provided is for actual usage (registration), and the inside of the table is in a sparse state. Thus, if the prefix unit to be searched for is made longer, efficiency in memory use is deteriorated. To get around this, in a hash table, when a search character string is used as an address, the character string is degenerated to no more than a certain numerical value to cause a plurality of character strings to share one area. Thus, after a table search, a check is required as to whether the acquired character string is really a character string to be searched for. In comparison with the LUT, however, a longer character string can be searched for in the equivalent table area.

FIG. 4 shows a character string search using a hash table. A hash code generating unit 206 generates a hash code 208 from the prefix unit "abc" of the input character string, and use the hash code as an address to access a hash table 210. In the hash table 210, a position in the buffer 200 corresponding to the hash code 208 is stored. By checking a character string "abcde" at that position against the input character string, it is checked whether both prefix units match with each other. Then, if they match with each other, it is determined that the character string matching with the input character sting is present in the buffer 200. As with the LUT, in the hash table, for plural character strings having the same prefix unit in the buffer, plural positions of appearance are retained in a form of a linked list. In either case, the linked list is used for searching for the longest-match character string.

However, such conventional data compression technologies include the following problems. First, when a LUT is used to search for a long character string, even if a table having an enormous area is used, only a part thereof is used, thereby causing the inside of the table to be in a sparse state. Although the hash table has a small table size compared with the LUT, the inside of the table is similarly in a sparse state if the input data is few. This poses a problem in which the memory is not necessarily used effectively. Moreover, when the longest-match character string is searched for, the plural positions of appearances retained in the linked list have to be traced one by one. This poses another problem in which, if the number of character strings having the same prefix unit is increased, it takes time to perform a search process.

To solve these problems, the inventors of the present invention have suggested a data compression method capable of performing a search with a less amount of memory in proportion to the amount of input data (Japanese Patent Application No. 2000-98834). This method is to provide an input buffer and create a search table for the input buffer at one time, instead of a conventional scheme of sequential registration in a search table while coding proceeds. For a search, a rank list is used in which character strings starting at respective addresses in the input buffer are sorted according to the contents of the character strings. Among others, a scheme of generating a recent match position list from the rank list and detecting from the recent match position list a portion where the same numbers are successively present to find a match can be implemented with the least amount of memory.

FIGS. 5A-5D show specific examples of the input buffer, the rank list, and the recent match position list for use in the method suggested by the inventors of the present invention. This method is processed in the following procedure.

(Data Input and List Generation)

In an input buffer 212 of FIG. 5A, data of a buffer size is input, a coding-target position address t is initialized as t=1, and then a rank list 214 of FIG. 5B and a recent match position list 216 of FIG. 5C are created. Here, the rank list 214 is created by sorting three-character strings starting at each address in the input buffer 212 in the order of a numerical value. Also, the recent match position list 216 has stored therein a relative position of the most-recently appearing address. For example, a character string "com" from an address 15 has most recently appeared at an address 1 and a relative position 14. Therefore, the relative position 14 is stored in the address 15 in the recent match position list 216. Here, in Japanese Patent Application No. 2000-98834, the address itself is stored in the recent match position list. In this case, the address 1 is stored at the address 15 in the recent match position list 216.

(Detection and Coding of a Matching Character String)

A matching character string is detected from a portion where the same numbers are successively present in the recent match position list 216. Referring to the recent match position list 216 in FIG. 5D, numbers 14 are successively present at addresses 15 to 20, numbers 9 are successively present at addresses 24 to 29, and numbers 23 are successively present at addresses 30 and 31. First, the numbers 14 successively present at the addresses 15 to 20 match with a character string from an address 15−14=1, a match length is 6+2=8, and a match position is 14. Thus, (match length, position)=(8, 14) is generated as a code. Also, the numbers 9 and 23 successively present at the addresses 24 to 29 and 30 to 32, respectively, match with a character string from an address 24−23=1, a match length is 9+2=11, and a match position is 23. Thus, (match length, position)=(11, 23) is generated as a code.

However, in the data compression method shown in FIGS. 5A-5D in which portions where the same numbers are successively present is detected from the recent match position list, the longest match cannot be detected for data, as shown in an input buffer 112 of FIG. 6A, such that a repetition of a long character string contains a repetition of a short character string forming the long character string. That is, in the input buffer 212, between long character strings "abcdef", short character strings "abc" and "cde" are repeated from addresses 7, 10, and 13. In a recent match position list 216 of FIG. 6B generated from the data of the input buffer 212, no portion where the same numbers are successively present is present, thereby posing a problem in which a repetition of the character string "abcdef" cannot be detected.

DISCLOSURE OF INVENTION

An object of the present invention is to provide a data compression method, program, and apparatus that allows coding by detecting a repetition of a matching character string even without successiveness of the same numbers in a recent match position list.

A basic of the present invention is to use a recent match position list for narrowing down candidates for a matching character string that have previously appeared and to perform detection and coding of a matching character string by performing comparison with each character string in the input buffer as a candidate.

(Method)

The present invention is to provide a data compression method that generates compressed data from a data string to be compressed. This data compression method includes:

an input step of inputting and retaining, by an input unit, the data string to be compressed in the input buffer;

a list generating step of generating and retaining, by a recent-match-position-list generating unit, a recent match position list having stored therein a relative position where each character string having a predetermined length starting at each address in the input buffer has most recently appeared;

a candidate acquiring step of acquiring, by a candidate acquiring unit, with the use of the recent match position list, a repetition candidate at a position where a character string at a coding position has previously appeared;

a match detecting step of comparing, by a match detecting unit, a character string starting at the position of the acquired repetition candidate and the character string at the coding position, and detecting a matching character string from the position of the repetition candidate; and a code generating step of coding, by a code generating unit, the detected matching character string.

Here, in the candidate acquiring step, a stored value acquired from the recent match position list with the coding position being taken as an address is taken as a first candidate for a character-string repetition position. In the match detecting step, a character string starting at a position of the first candidate and the character string starting at the coding position are compared, and a matching character string is acquired and coded.

According to this data compression method of the present invention, even without successiveness of the same numbers in the recent match position list, candidates are narrowed down in the recent match position list, thereby achieving at a high-speed a process of detecting a repetition of a matching character string for coding. Also, by detecting a match by comparison with a character string in the input buffer, a match detection for a longer character string can be performed. Furthermore, only the input buffer and the recent match position list are used as search tables, thereby achieving implementation with a small amount of memory.

A first embodiment of the candidate acquiring step in the data compression method of the present invention further includes:

a first step of taking the first candidate as an evaluation value; and a second step of comparing the stored value acquired from the recent match position list and the evaluation value with each address subsequent to the coding position being taken as an address and, when the acquired stored value is a value previous to the evaluation value, acquiring one or a plurality of subsequent candidates in order of increasing distance from the coding position, and in the match detecting step, each of character strings starting at the first candidate and the subsequent candidates and the character string starting at the coding position are compared, and a character string having the longest match length is acquired and coded.

Here, in the candidate acquiring step, when the subsequent candidate is acquired, a value of the acquired subsequent candidate may be taken as an evaluation value for acquiring a next subsequent candidate.

Also, a second embodiment of the candidate acquiring step in the data compression method of the present invention further includes:

a first step of taking a value acquired from the recent match position list with the first candidate being taken as an address; and a second step of comparing a stored value acquired from the recent match position list and the evaluation value with each address subsequent to the coding position being taken as an address and, when the acquired stored value is a value previous to the evaluation value, acquiring one or a plurality of subsequent candidates in order of increasing distance from the coding position, and in the match detecting step, each of character strings starting at the first candidate and the subsequent candidates and the character string starting at the coding position are compared, and a character string having the longest match length is detected and coded.

Also in this case, in the candidate acquiring step, when the subsequent candidate is acquired, the value acquired from the recent match position list with a value of the acquired subsequent candidate being taken as an address of the acquired subsequent candidate may be taken as an evaluation value for acquiring a next subsequent candidate.

Still further, in a third-embodiment of the candidate acquiring step in the data compression method of the present invention, as one or plural subsequent candidates following the first candidate, a stored value acquired from the recent match position list with a preceding candidate being taken as an address, and in the match detecting step, each of character strings starting at the first candidate and the subsequent candidates and the character string starting at the coding position are compared, and a character string having the longest match length is acquired and coded.

Still further, a fourth embodiment of the candidate acquiring step in the data compression method of the present invention further includes:

a first step of comparing, with the first candidate being taken as an evaluation value, a stored value acquired from the recent match position list and the evaluation value with each position subsequent to the coding position being taken as an address and, when the acquired stored value is a value previous to the evaluation value, acquiring one or plural subsequent candidates following the first candidate in order of increasing distance from the coding position, comparing character strings starting at the first candidate and the subsequent candidates and the character string starting at the coding position, and taking, as a revised first candidate, a character string having the longest match length with respect to the character string at the coding position; and a second step of taking, as one or plural revised subsequent candidates following the revised first candidate, a stored value acquired from the recent match position list as revised subsequent candidates with a preceding candidate being taken as an address, and in the match detecting step, character strings starting at the revised first candidate and the revised subsequent candidates and the character string starting at the coding position are compared, and a character string having the longest match length is detected and coded.

In the code generating step in the data compression method of the present invention, the character string from the coding position is coded with a relative position and the match length of the detected matching character string.

(Program)

The present invention provides a program that generates compressed data from a data string to be compressed. This program causes a computer to execute steps including:

an input step of inputting and retaining the data string to be compressed in the input buffer;

a list generating step of generating and retaining a recent match position list having stored therein a relative position where each character string having a predetermined length starting at each address in the input buffer has most recently appeared;

a candidate acquiring step of acquiring, by using the recent match position list, a repetition candidate at a position where the character string at a coding position has previously appeared;

a match detecting step of comparing a character string starting at the position of the acquired repetition candidate and the character string starting at the coding position, and acquiring a matching character string from the position of the repetition candidate; and a code generating step of coding the detected matching character string. Here, details on this program are basically the same as those on the data compression method.

(Apparatus)

The present invention provides a data compression apparatus that generates compressed data from data to be compressed. This apparatus includes:

an input buffer that input and retain, in the input buffer, a data string to be compressed;

a recent-match-position-list generating unit that generates and retains a recent match position list having stored therein a relative position where each character string having a predetermined length starting at each address in an input buffer has most recently appeared;

a candidate acquiring unit that acquires, by using the recent match position list, a repetition candidate at a position where the character string at the coding position has previously appeared;

a match detecting unit that compares a character string starting at the position of the acquired repetition candidate and the character string starting at the coding position, and detecting a matching character string from the repetition candidate; and a code generating unit that codes the detected matching character string. Here, details on this data compression apparatus are basically the same as those on the data compression method.

BRIEF DESCRIPTION OF DRAWINGS

FIGS. 5A-5D are illustrative diagrams of a matching character string search using a recent match position list suggested by the inventors of the present invention;

FIGS. 9A, 9B are illustrative diagrams of a data compressing process according to a first embodiment of the present invention;

FIGS. 12A and 12B are illustrative drawings of a data compressing process according to a second embodiment of the present invention;

FIGS. 18a and 18B are illustrative diagrams of a data compressing process according to a fourth embodiment of the present invention;

BEST MODE FOR CARRYING OUT THE INVENTION

Figure 1:
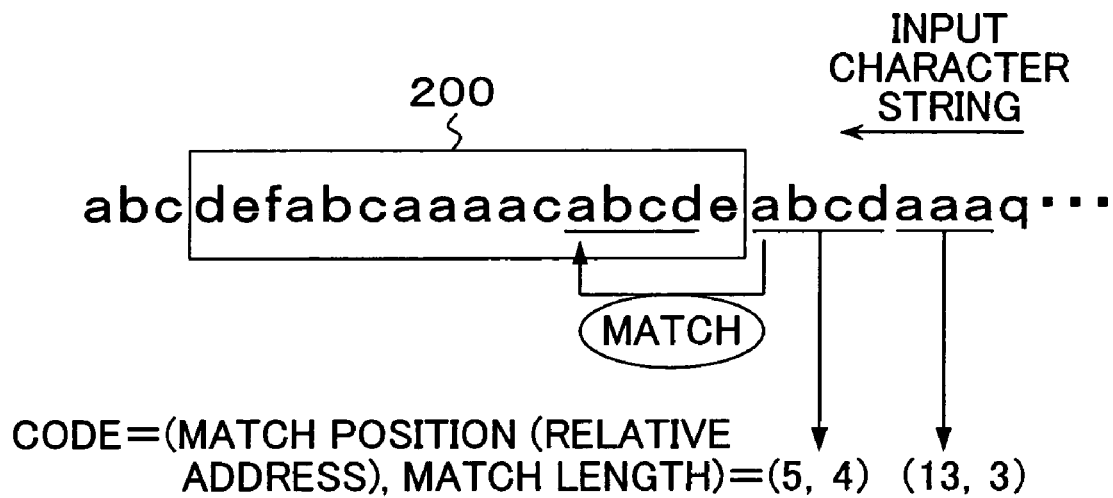
FIG. 1 is an illustrative diagram of a data compressing process by a conventional LZ77.
Figure 2:
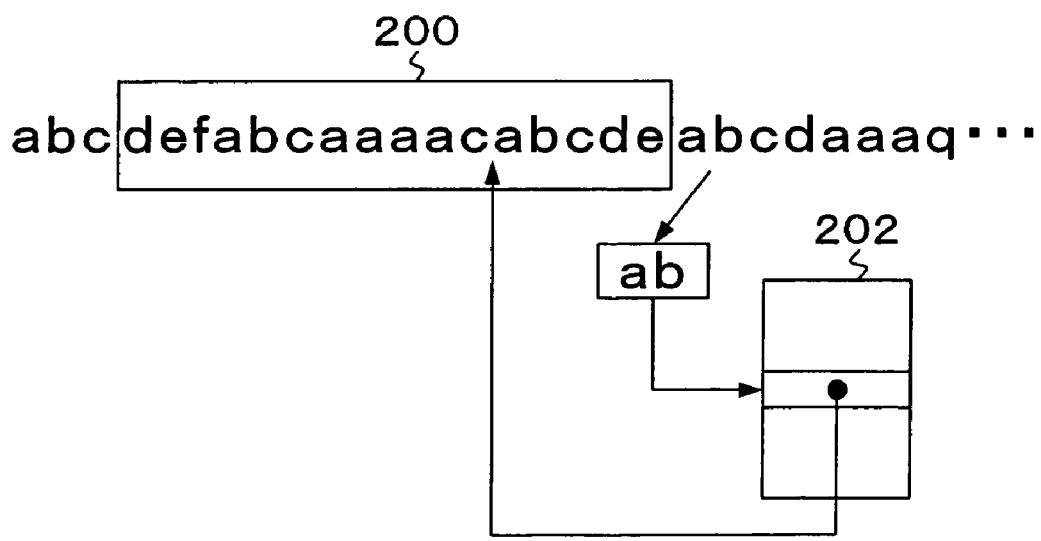
FIG. 2 is an illustrative diagram of a process using a LUT in LZ77.
Figure 3:
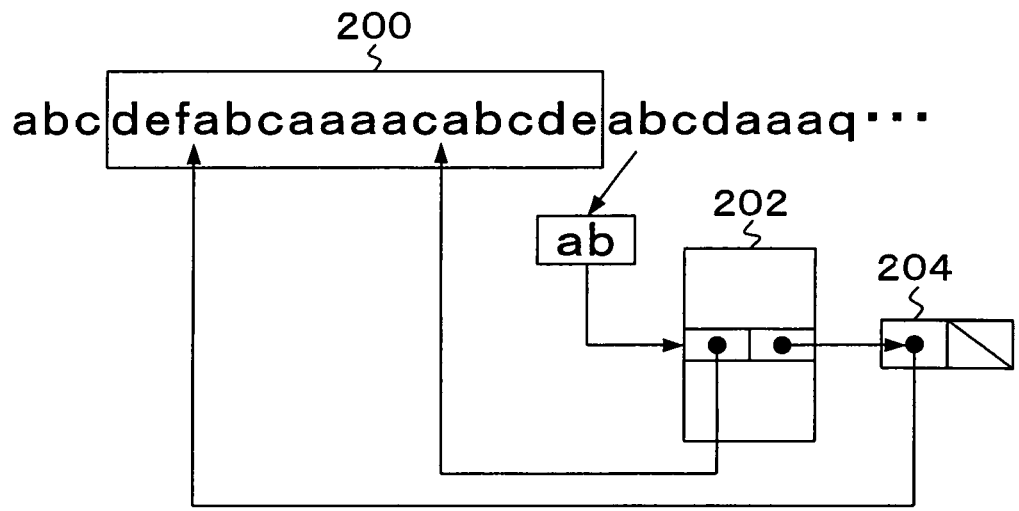
FIG. 3 is an illustrative diagram of a process using a linked list in LZ77.
Figure 4:
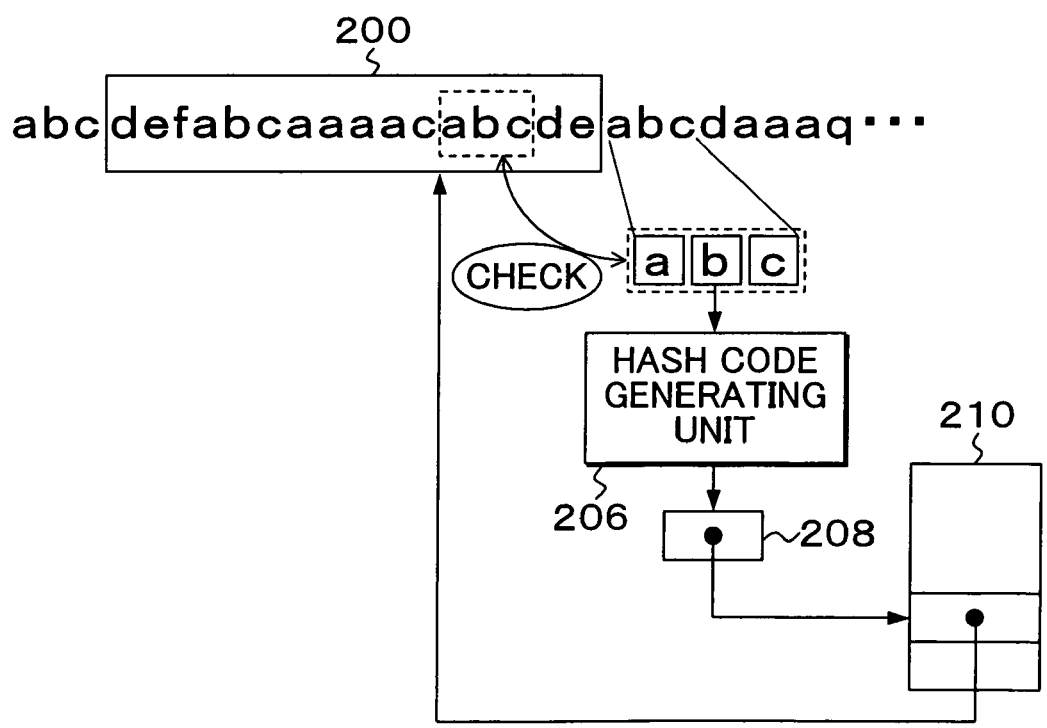
FIG. 4 is an illustrative diagram of a process using a hash table in LZ77.
Figure 6A:
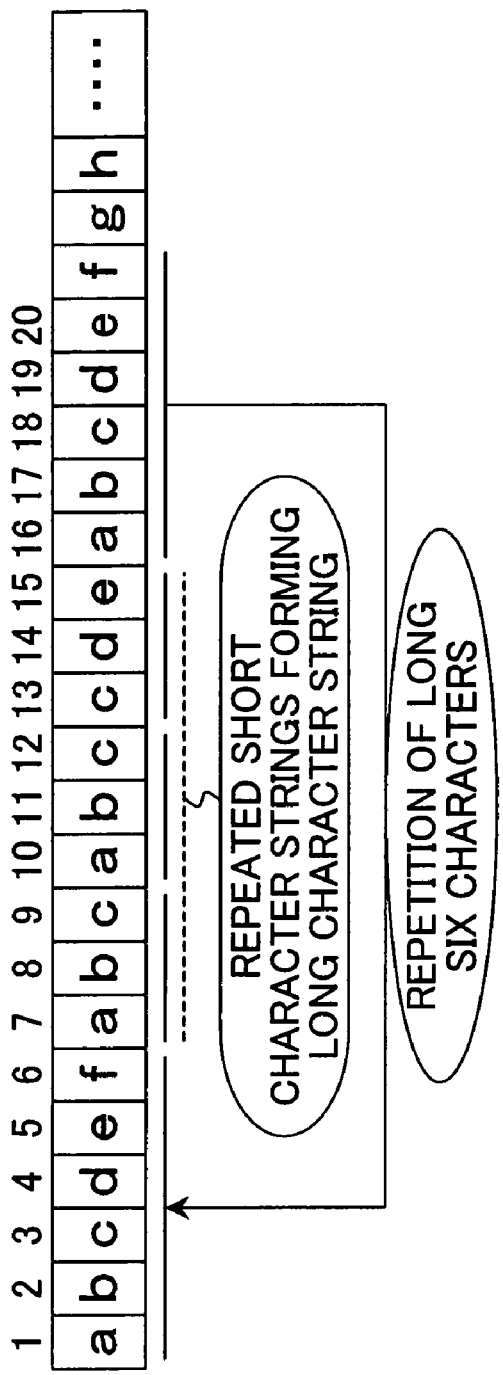
FIGS. 6A and 6B are illustrative diagrams of an example in which repetition of a character string is present in an input buffer but the same numbers are not successively present in the recent match position list.
Figure 6B:
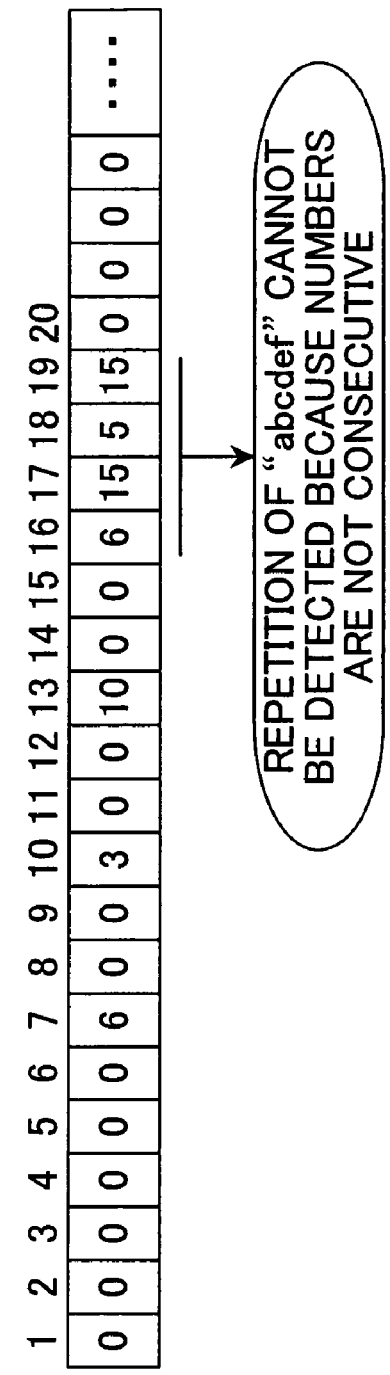
Figure 7:
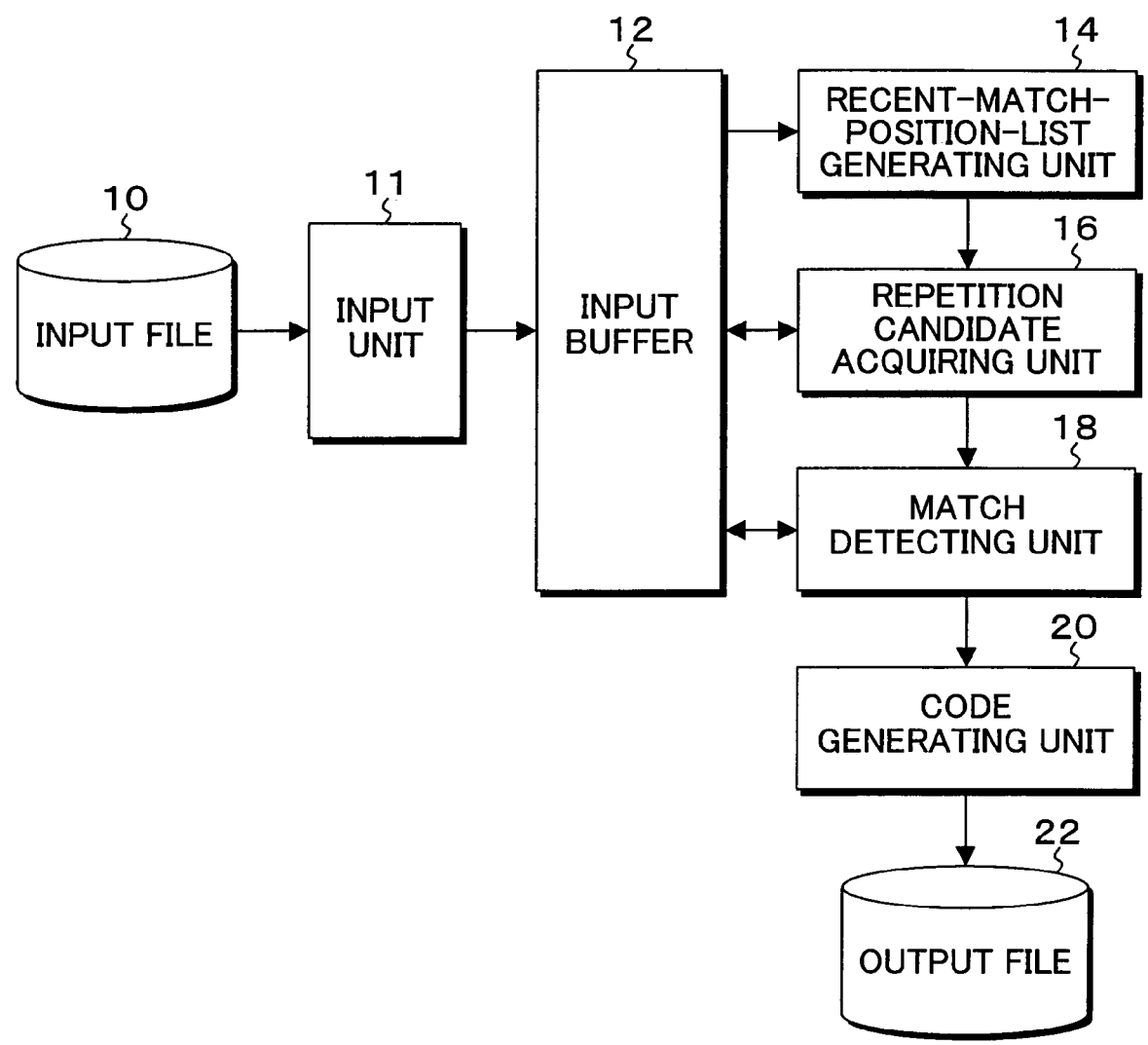
FIG. 7 is a block diagram of a functional structure of the present invention.

FIG. 7 is a block diagram of a functional structure of a data compression apparatus according to the present invention. In FIG. 7, the data compression apparatus of the present invention includes an input file 10, an input unit 11, an input buffer 12, a recent-match-position-list generating unit 14, a repetition candidate acquiring unit 16, a match detecting unit 18, a code generating unit 20, and an output file 22. The input file 10 has stored therein data to be compressed for data compression. The data to be compressed of this input file is cut out by the unit 11 for a buffer size of the input buffer 12, and is then input to the input buffer 12 for retention. The recent-match-position-list generating unit 14 generates a recent match position list 24 having stored therein a relative position at which, in a string of the data to be compressed that is retained in the input buffer 12, each character string having a predetermined length, for example, each character string having three characters, starting at each address in the input buffer has most recently appeared. The match detecting unit 18 uses the recent match position list 24 to acquire a repetition candidate at a position where a character string at a coding position has previously appeared. That is, the match detecting unit 18 uses the recent match position list 24 to narrow down candidates for a matching character string that have previously appeared. The code generating unit 20 compares a character string starting at the position of the repetition candidate acquired by the match detecting unit 18 and the character string starting at the coding position to detect a character string having the longest match length. Further, the code generating unit 20 codes the matching character string detected by the match detecting unit 18. This coding is performed with (relative position, match length) of the detected matching character string. The code generated by the code generating unit 20 is stored in the output file 22 as compressed data, and file transfer or file storage is performed as required. In such a data compression apparatus of the present invention, as methods performed by the repetition candidate acquiring unit 16 of narrowing down candidates for a repetition character string by using the recent match position list 24, the present invention includes four methods clarified by the following first, second, third, and fourth embodiments.

Figure 8:
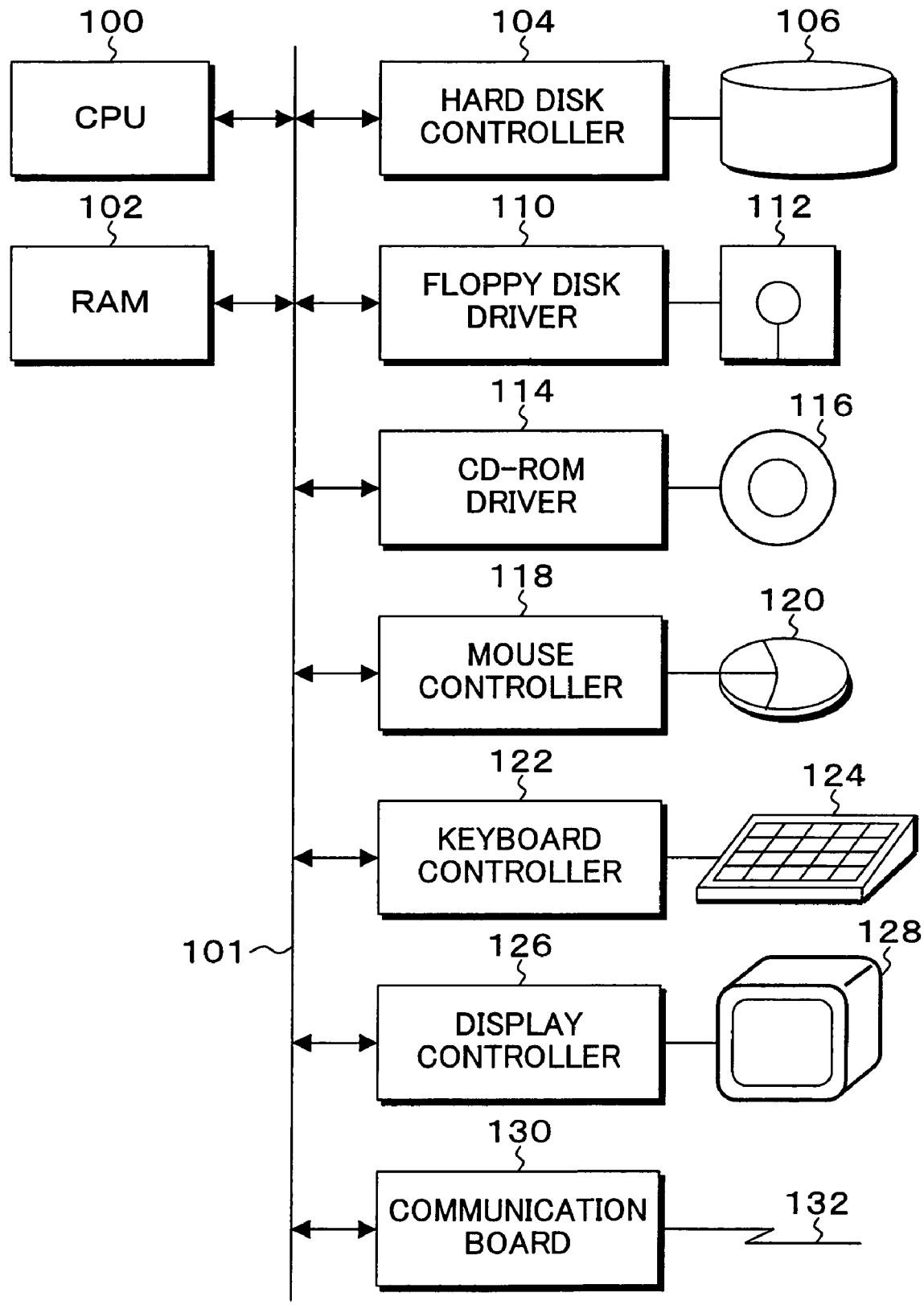
FIG. 8 is an illustrative diagram of a hardware environment of a computer to which embodiments of the present invention is applied.

The data compression apparatus of the present invention in FIG. 7 is implemented by hardware resources of a computer as shown in FIG. 8, for example. In the computer of FIG. 8, a bus 101 of a CPU 100 has connected thereto a hard disk controller (software) 104, a floppy disk driver (software) 110, a CD-ROM driver (software) 114, a mouse controller 118, a keyboard controller 122, a display controller 126, and a communication board 130. The hard disk controller 104 connects a hard disk drive 106 to load an application program for executing a data compressing process of the present invention, and invokes a required program from the hard disk drive 106 at the time of starting the computer and develops the program on a RAM 102, the program being executed by the CPU 100. The floppy disk driver 110 has connected thereto a floppy disk drive (hardware) 112, thereby allowing read from and write to a floppy disk (R). To the CD-ROM driver 114, a CD drive (hardware) 116 is connected, thereby allowing a read of data or a program stored in a CD. The mouse controller 118 transmits an input operation of a mouse 120 to the CPU 100. The keyboard controller 122 transmits an input operation of a keyboard 124 to the CPU 100. The display controller 126 performs a display on a display unit 128. The communication board 130 uses a communication line 132 for communication with another computer and server via a network, such as the Internet.

FIGS. 9A and 9B are illustrative diagrams of a data compressing process according to a first embodiment of the present invention. In the first embodiment, the repetition candidate acquiring unit 16 of FIG. 7 performs the following process.

(1) With the coding position being taken as an address, a position acquired from the recent match position list 24 is taken as a first candidate for a repetition position of a character string.

(2) The first candidate is taken as an evaluation value.

(3) With respective positions subsequent to the coding position, that is, positions obtained by adding +1, +2, +3, . . . +N to the coding position, being taken as addresses, each stored value acquired from the recent match position list 24 and the evaluation value are compared, and if the acquired stored value is a value previous to the evaluation value, specifically, if the acquired stored value is larger than the evaluation value, one or plural subsequent candidates following the first candidate, that is, a second candidate, a third candidate, . . . , are taken in order of increasing distance from the coding position.

When such candidates including the first candidate and its subsequent candidates, that is, the second candidates and thereafter, are acquired by the repetition candidate acquiring unit 16, the match detecting unit 18 of FIG. 7 compares a character string starting at each of the addresses of the first candidate and its subsequent candidates and the character string starting at the coding position, and acquires a character string having the longest match length to cause the code generating unit 20 to perform coding. The process according to the first embodiment is specifically described in the following with reference to a character string stored in the input buffer 12 of FIG. 9A and the recent match position list 24 of FIG. 9B generated from the character string in the input buffer 12.

For the character string as data to be compressed that is retained in the input buffer 12 of FIG. 12A, the recent match position list 24 is generated, which has stored therein a relative position at which each character string having a predetermined length, for example, three characters, and starting at each address in the input buffer 12. This recent match position list 24 is generated such that, for a character string "abc" from an address 1 of the input buffer 12, no character string that has most recently appeared is present, and therefore a value of "0" is retained at an address 1 of the recent match position list 24, indicating that no matching character string is present. Also for addresses 2 to 6 of the input buffer 12, no character string that has most recently appeared is present, and therefore 0 is retained at addresses 2 to 6 of the recent match position list 24. Then, for a character string "abc" from an address 7 of the input buffer 12, a character string "abc" from the address 1 is present as a character string that has most recently appeared, and therefore a value indicative of a relative position of 7−1=6 is retained at an address 7 of the recent match position list 24. Thereafter, similarly, based on the input buffer 12, 0 is stored at each address in the recent match position list 24 when no character string that has recently appeared is present, and a value indicative of a relative position is stored thereat when such a character string is present. In this manner, upon completion of generating the recent match position list 24, the repetition candidate acquiring unit 16 of FIG. 7 uses the generated recent match position list 24 to narrow down candidates for a repetition character string. Now, description is made as follows by assuming in FIGS. 9A and 9B that an address 19 of the input buffer 12 is a coding position 26. First, by referring to the recent match position list 24 with the address 19 of the input buffer 12, a stored value at the address 19 is taken as a first candidate for a character-string repetition position. The position of this first candidate is obtained by 19−6=13 from the address 19 and its stored value 6, and is therefore a position of an address 13 as indicated by an arrow 36. This means that a repetition character string from the address in the input buffer 12 is taken as a first candidate 28. Then, with positions obtained by adding +1, +2, . . . +N to the coding position 26 as addresses, the recent match position list 24 is referred to, and 10, 5, and 18 are acquired as stored values of the respective addresses. In this manner, the stored value acquired from the address of each position subsequent to the coding position 26 is compared with the evaluation value of 6 given by the stored value at the first candidate position, and a stored value larger than the evaluation value is taken as a subsequent candidate. The subsequent candidates are ranked in order of increasing distance from the coding position 26 as a first candidate, a second candidate, . . . There are three stored values at positions subsequent to the coding position 26, that is, a stored value of 10 at the address 20, a stored value 5 at the address 21, and a stored value of 18 at the address 22. Of these, those that are larger than the evaluation value are the stored values 10 and 18. Of these, the stored value 10 at the address 20 of which the distance from the coding position 26 is shorter is taken as a second candidate for a repetition position. The position of the second candidate is, as indicated by an arrow 38, a position at an address 9 because 19−10=9, and a character string from the address 9 of the input buffer 12 is taken as a second candidate 30. Furthermore, a repetition position based on the stored value 18 at the address 22 of the recent match position list 24 is taken as a third candidate, and the position of the third candidate is, as indicated by an arrow 42, a position at the address 1 because 19−18=1. Thus, a corresponding character string from the address 1 of the input buffer 12 is taken as a third candidate 32. In this manner, upon acquisition of the first candidate, the second candidate, and the third candidate for the character-string repetition position, for each of the candidates, that is, the character string of the first candidate 28 from the address 13, the character string of the second candidate 30 from the address 9, and the third candidate 32 of the third candidate 32 from the address 1, match comparison with the character string from the coding position 26 is performed. Then, a character string having the longest match length is acquired for coding. In this case, the character string from the third candidate 32 is the longest and matches with the character string from the coding position 26. Thus, a matching character string is "abcdef", and therefore coding is performed with (relative position, match length)=(18, 6). Here, in the embodiment of FIGS. 9A and 9B, the first candidate is used as the evaluation value for finding the third candidate. Alternatively, either one of the first candidate and the first candidate that has a longer match may be used. However, in FIGS. 9A and 9B, the match length of the second candidate is 0, and therefore the fits candidate is inevitably used for acquiring a third candidate.

Figure 10:
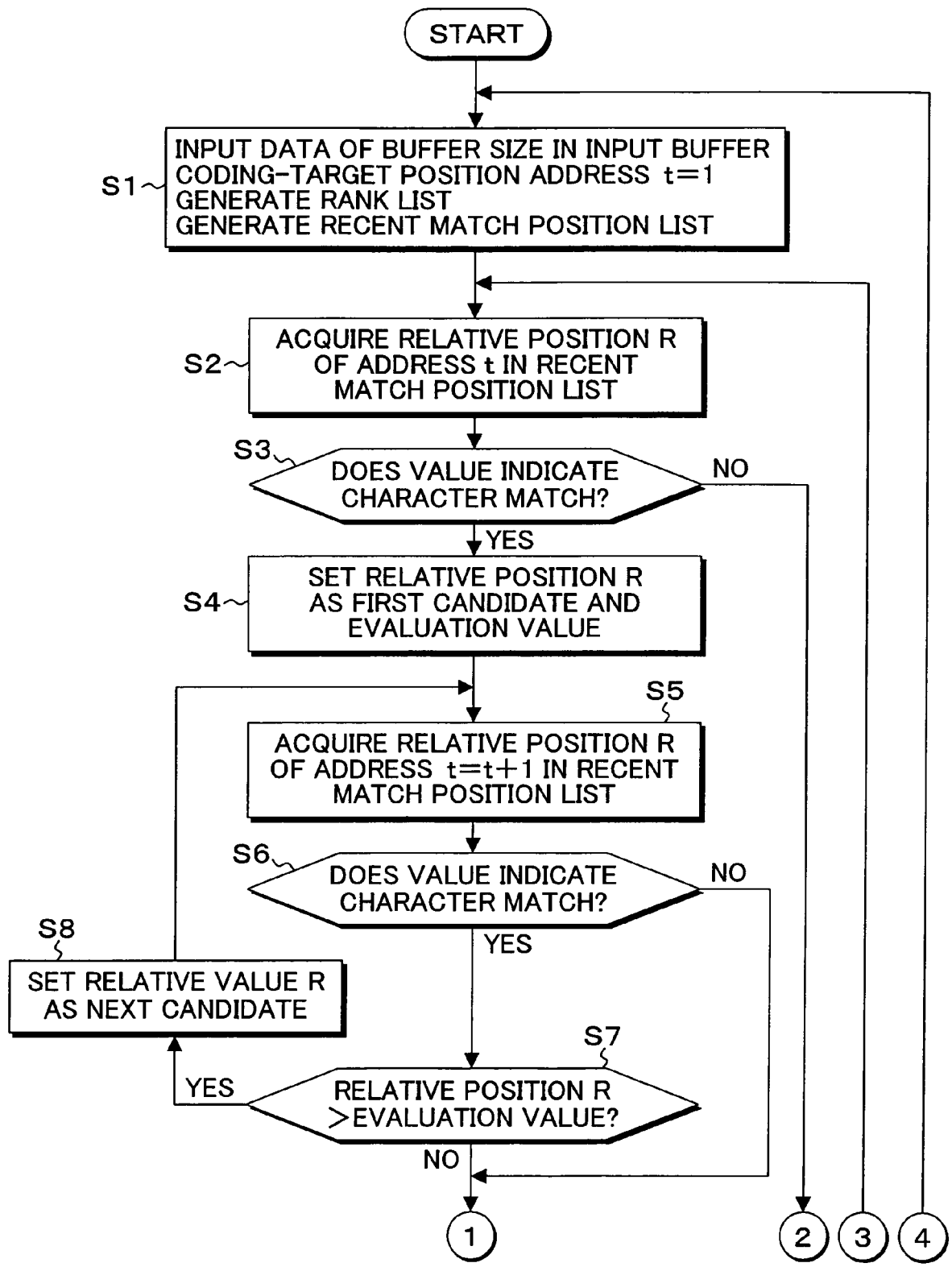
FIG. 10 is a flowchart of the data compressing process according to the first embodiment of FIGS. 9A and 9B.
Figure 11:
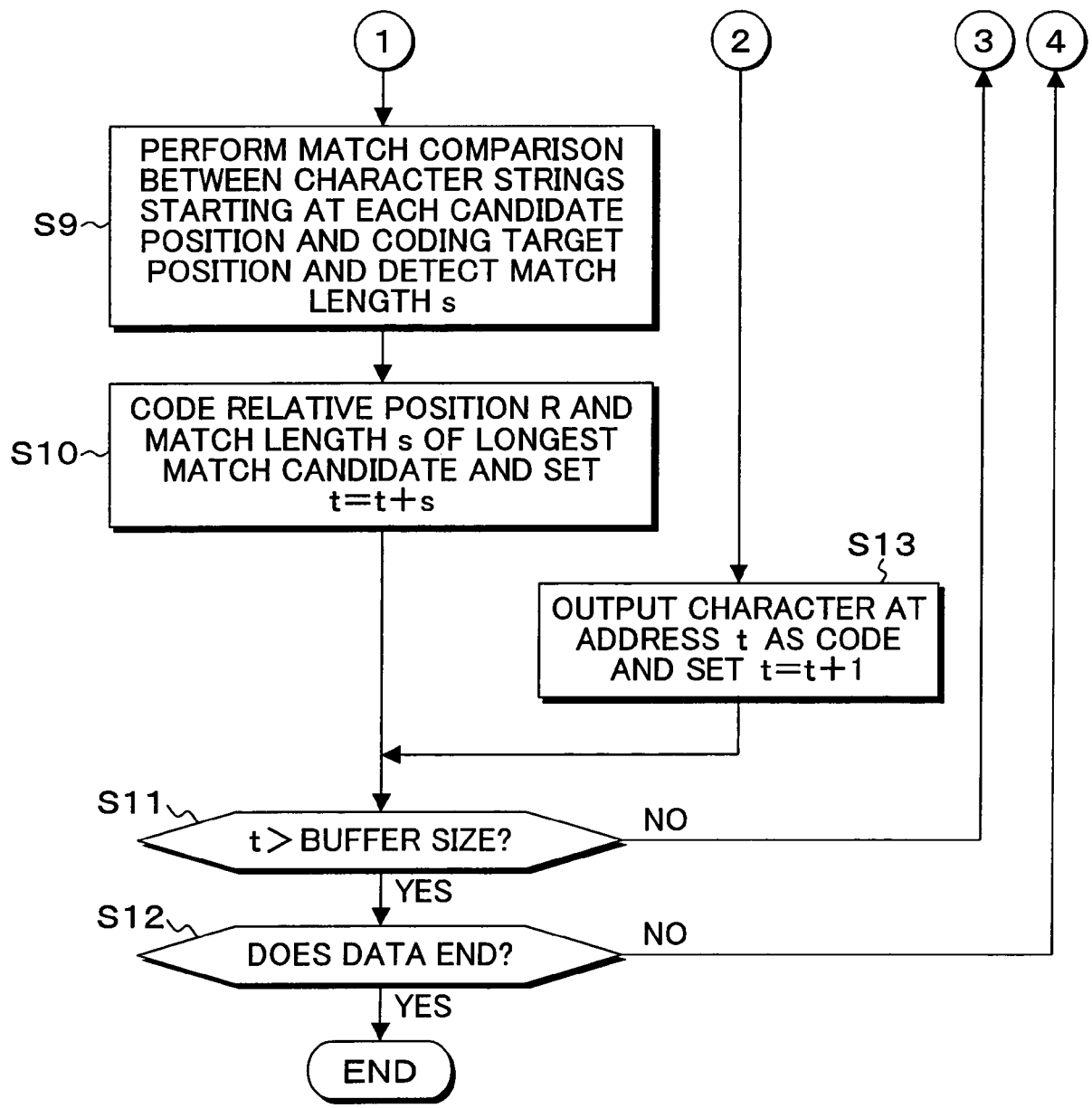
FIG. 11 is the flowchart of the data compressing process continued from FIG. 10.

FIGS. 10 and 11 are a flowchart of the data compressing process according to the first embodiment of the present invention, and the procedure goes as follows.

Step S1: Data of the buffer size is input to the input buffer, a coding-target position address t is initialized as t=1, and a rank list and a recent match position list are generated.

Step S2: A relative position Ri is acquired from the address t in the recent match position list.

Step S3: It is checked whether the value of the acquired relative position Ri is a value other than 0, the value being indicative of a character match. If the value is such a value, the procedure goes to step S4, and if otherwise, the procedure goes to step S13.

Step S4: The value of the relative position Ri is set as a first candidate and an evaluation value.

Step S5: A relative position R of an address t=t+1 is acquired from the coding position address t.

Step S6: It is checked whether the value of the acquired relative position R is a value other than 0, the value being indicative of a character match. If the value is such value, the procedure goes to step S7, and if otherwise, the procedure goes to step S9.

Step S7: It is checked whether the value of the acquire relative position R is larger than the evaluation value. If the value is larger, the procedure goes to step S8, and if otherwise, the procedure goes to step S9.

Step S8: The relative position R is set as the next candidate, and then the procedure returns to step S5.

Step S9: This is the case where the value of the acquired relative value is 0 indicative of no character match. A match comparison is performed between each of the character strings starting at the candidate positions and the character string starting at the coding target position, and a match length s is detected.

Step S10: After the relative position R and the match length s of the longest-match-candidate character string are coded, t=t+s is set.

Step S11: If the coding position address t becomes larger than the buffer size, the procedure goes to step S12, and if otherwise, the procedure returns to step S2.

Step S12: It is checked whether the data to be compressed ends. If the data ends, the procedure ends, and if otherwise, the procedure returns to step S1.

Step S13: This is the case where the value does not indicate a character match in step S3. The character at the address t is output as it is as a code, and with t=t+1, the procedure goes to step S11.

FIGS. 12A and 12B are illustrative diagrams of a data compressing process according to a second embodiment of the present invention. In this second embodiment, the repetition candidate acquiring unit 16 of FIG. 7 performs the following process.

(1) With the coding position 26 being taken as an address, a stored value of 6 acquired from the recent match position list 24 is taken as a first candidate for a repetition position of a character string.

(2) The first candidate of 6 indicates a relative value from the coding position 26. Therefore, with an address obtained from 19−6=13, the value of 6 acquired from the address of 13 in the recent match position list 24 is converted to a relative position from the coding position 26. That is, 6+6=12 is taken as an evaluation value.

(3) With positions subsequent to the coding position 26, that is, positions obtained by adding +1, +2, . . . +N, being taken as addresses 19, 20, 21, and 22, respectively, each of stored values of 10, 5, and 18 acquired from the recent match position list 24 and the evaluation value of 12 are compared, and when an acquired stored value(s) is larger than the evaluation value, one or plural subsequent candidates following the first candidate are taken in order of increasing distance from the coding position 26. In this example, a stored value of 18 at the address 22 is taken as a second candidate.

In this manner, upon acquisition of the first candidate and the second candidate by the repetition candidate acquiring unit 16, the match detecting unit 18 of FIG. 7 performs a match comparison 34 between a character string of the first candidate 28 from the address 13 of the input buffer 12 with a first candidate address being 19−6=13, a character string of the second candidate 44 from the address 1 of the input buffer 12 with a second candidate address being 19−18=1, and the character string from the coding position 26, and a character string having the longest match, that is, characters "abcdef", is detected from a match comparison with the second candidate 44 from the address 1. The code generating unit 20 then performs coding with (relative position, match length)=(18, 6).

Figure 13:
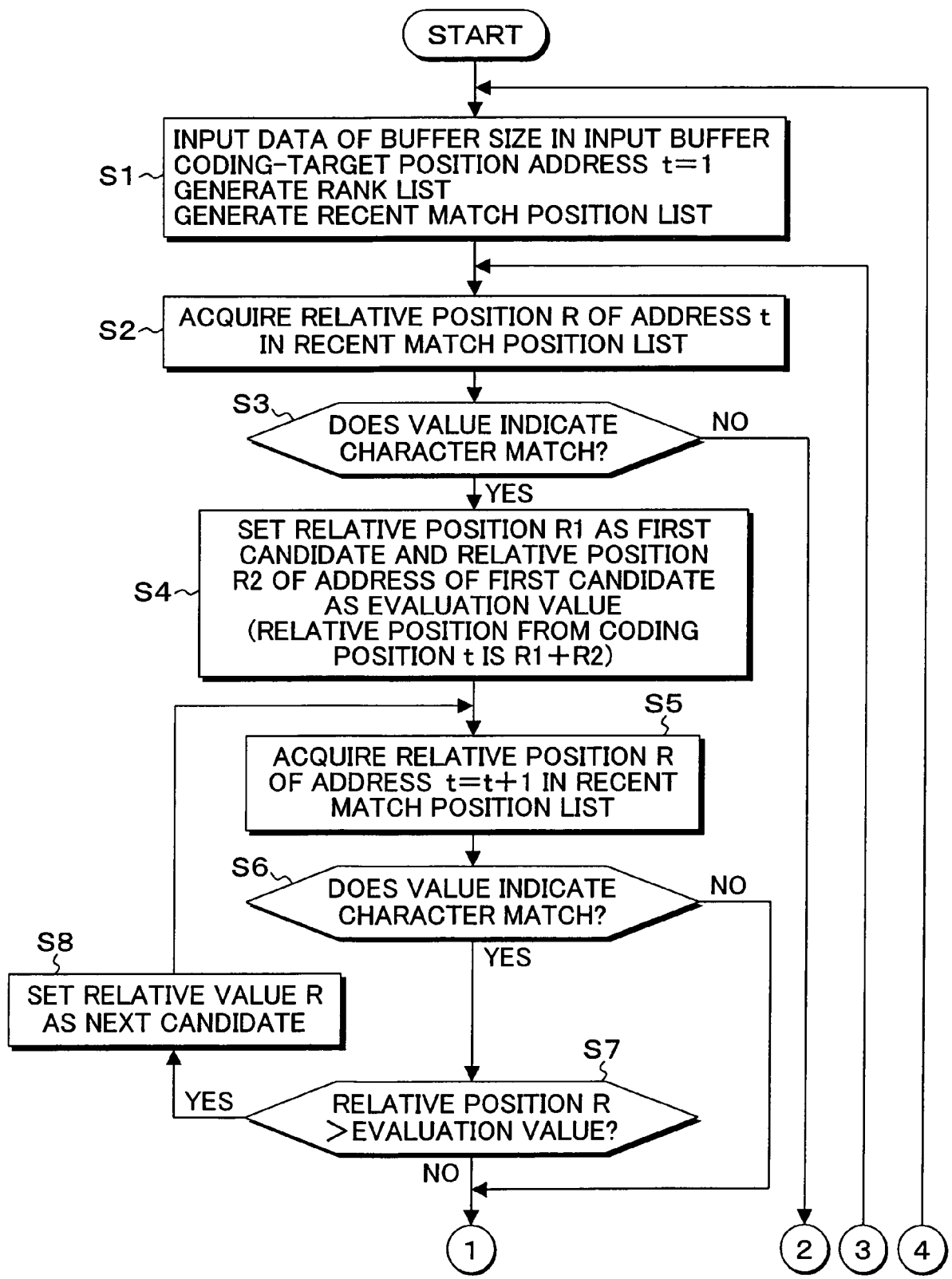
FIG. 13 is a flowchart of the data compressing process according to the second embodiment of FIGS. 12A and 12B.
Figure 14:
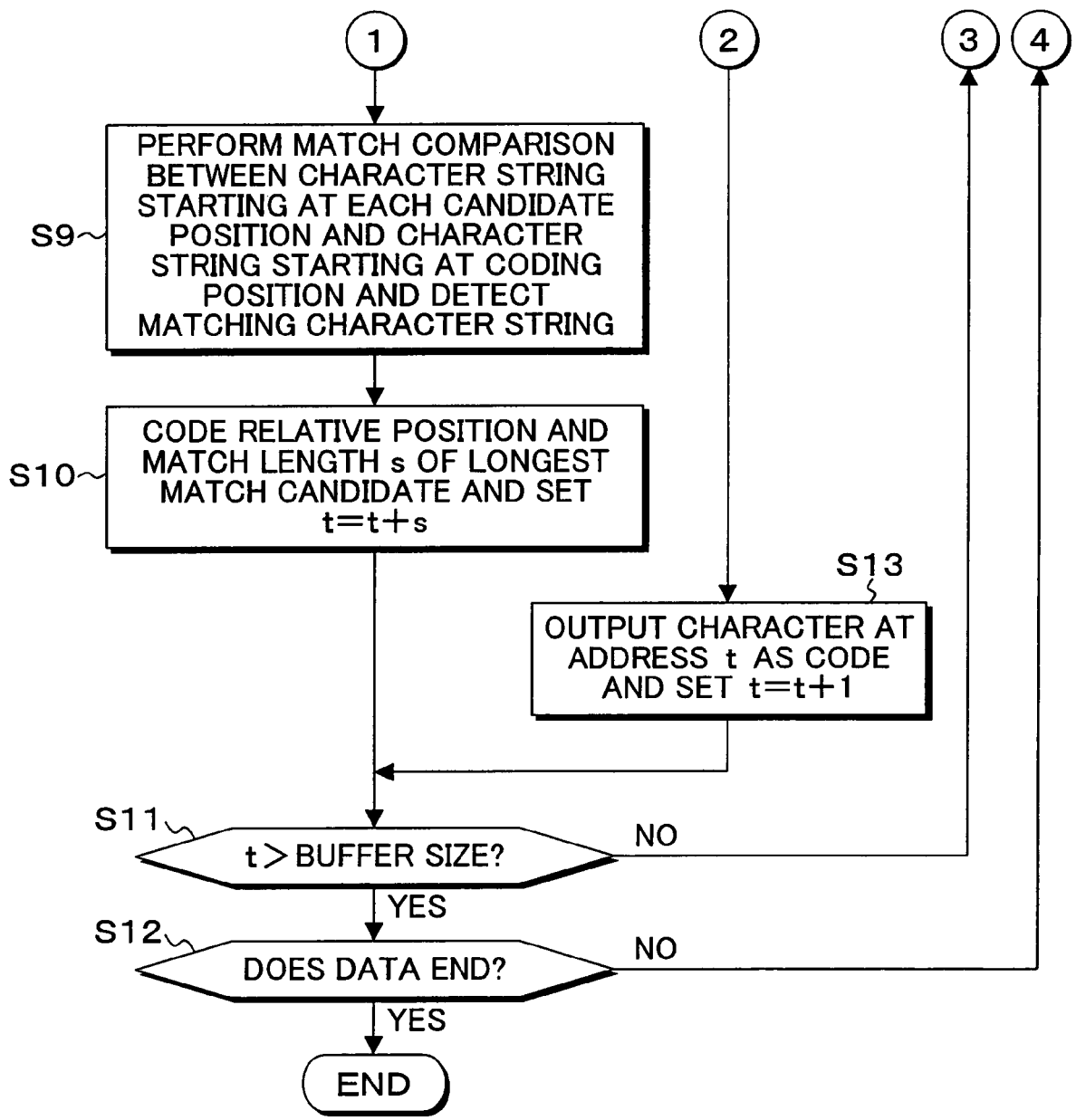
FIG. 14 is the flowchart of the data compressing process continued from FIG. 13.

FIGS. 13 and 14 are a flowchart of the data compressing process according to the second embodiment of the present invention, and the procedure goes as follows.

Step S1: Data of the buffer size is input to the input buffer, a coding-target position address t is initialized as t=1, and a rank list and a recent match position list are generated.

Step S2: A relative position R1 is acquired from the address t in the recent match position list.

Step S3: It is checked whether the value of the acquired relative position R1 is a value other than 0, the value being indicative of a character match. If the value is such a value, the procedure goes to step S4, and if otherwise, the procedure goes to step S13.

Step S4: The value of the relative position R1 is set as a first candidate, and a relative position R2 of the address of the first candidate is set as an evaluation value (a relative position from the coding position t is R1+R2).

Step S5: A relative position R of an address t=t+1 is acquired from the coding position address t.

Step S6: It is checked whether the value of the acquired relative position R is a value other than 0, the value being indicative of a character match. If the value is such value, the procedure goes to step S7, and if otherwise, the procedure goes to step S9.

Step S7: It is checked whether the value of the acquire relative position R is larger than the evaluation value. If the value is larger, the procedure goes to step S8, and if otherwise, the procedure goes to step S9.

Step S8: The relative position R is set as the next candidate, and then the procedure returns to step S5.

Step S9: This is the case where the value of the acquired relative value is 0 indicative of no character match. A match comparison is performed between each of the character strings starting at the candidate positions and the character string starting at the coding target position, and a match length s is detected.

Step S10: After the relative position R and the match length s of the longest-match-candidate character string are coded, t=t+s is set.

Step S11: If the coding position address t becomes larger than the buffer size, the procedure goes to step S12, and if otherwise, the procedure returns to step S2.

Step S12: It is checked whether the data to be compressed ends. If the data ends, the procedure ends, and if otherwise, the procedure returns to step S1.

Step S13: This is the case where the value does not indicate a character match in step S3. The character at the address t is output as it is as a code, and with t=t+1, the procedure goes to step S11.

Here, in the second embodiment of FIGS. 12A and 12B, the first candidate is used as the evaluation value for finding the third candidate and thereafter. Alternatively, either one of the first candidate and the first candidate that has a longer match may be used. However, in this case, the third candidate is not present.

Figure 15:
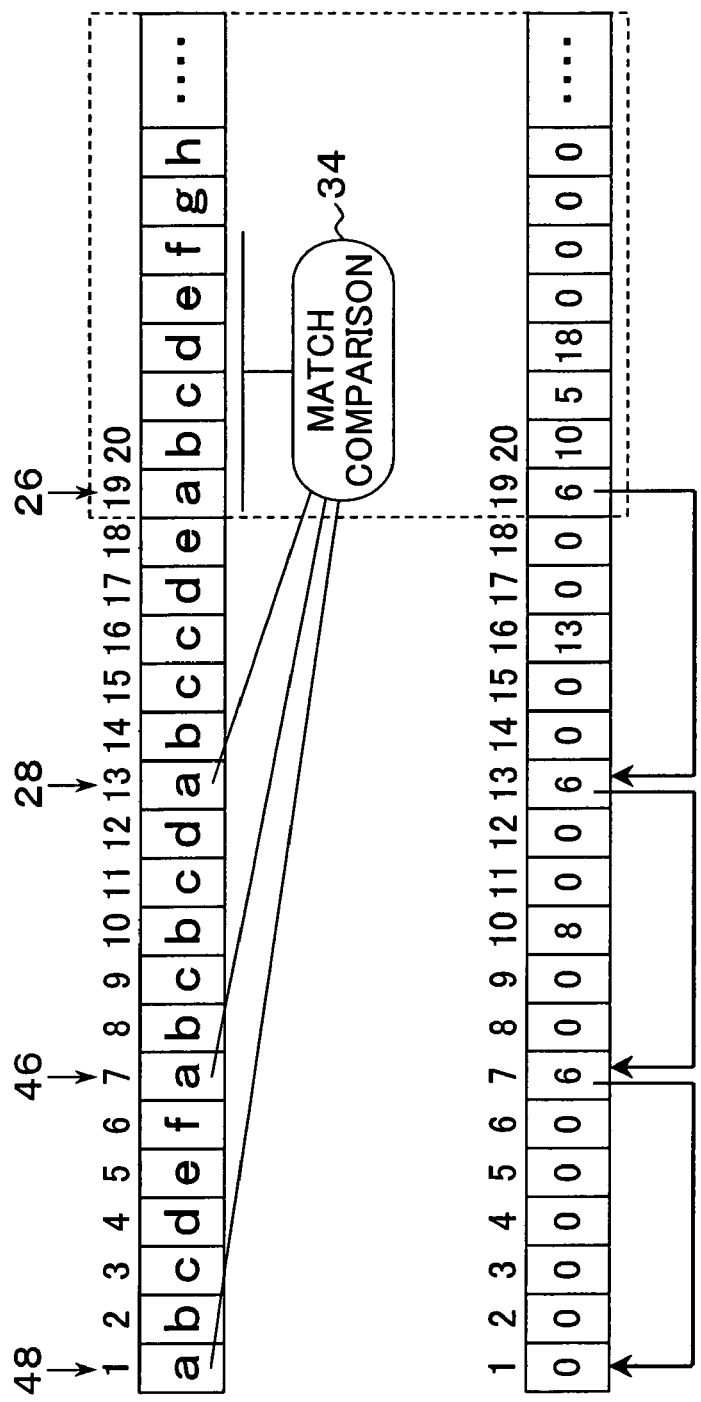
FIGS. 15A and 15B are illustrative drawings of a data compressing process according to a third embodiment of the present invention.

FIGS. 15A and 15B are illustrative diagrams of a data compressing process according to a third embodiment of the present invention. In this third embodiment, the repetition candidate acquiring unit 16 of FIG. 7 performs the following process.

(1) With the coding position 26 in the input buffer 12 being taken as an address 19, a stored value of 6 acquired from the recent match position list 24 is taken as a first candidate for a repetition position of a character string.

(2) As a subsequent candidate following the first candidate, a stored value acquired from the recent match position list 24 with a preceding candidate being taken as an address is taken as a subsequent candidate. That is, with the first candidate being taken as an address 19−6=13, a stored value of 6 acquired from the address 13 in the recent match position list 24 is taken as a second candidate. Also, with the second candidate being taken as an address 13−6=7, a stored value of 6 acquired from the address 7 in the recent match position list 24 is taken as a third candidate. Furthermore, with the third candidate being taken as an address 7−6=1, a stored value of 6 acquired from the address 1 in the recent match position list 24 is taken as a fourth candidate.

In this manner, upon acquisition of the candidates for a position of a repetition character string, that is, the first candidate, the second candidate, and the third candidate, the match detecting unit 18 of FIG. 7 performs a match comparison 34 between each of character strings starting from the addresses 13, 7, and 1 of a first candidate 28, a second candidate 46, and a third candidate 48, respectively, and the character string from th coding position 26, and a character string having the longest match is acquired and then coded by the code generating unit 20. In this example, the character string from the third candidate 48 "abcdef" is the character string having the longest match with the character string from the coding position 26. Therefore, a relative position of the third candidate 48 is found as 19−1=18 and a match length is found as 6. With (relative position, match length)=(18, 6), coding is performed.

Figure 16:
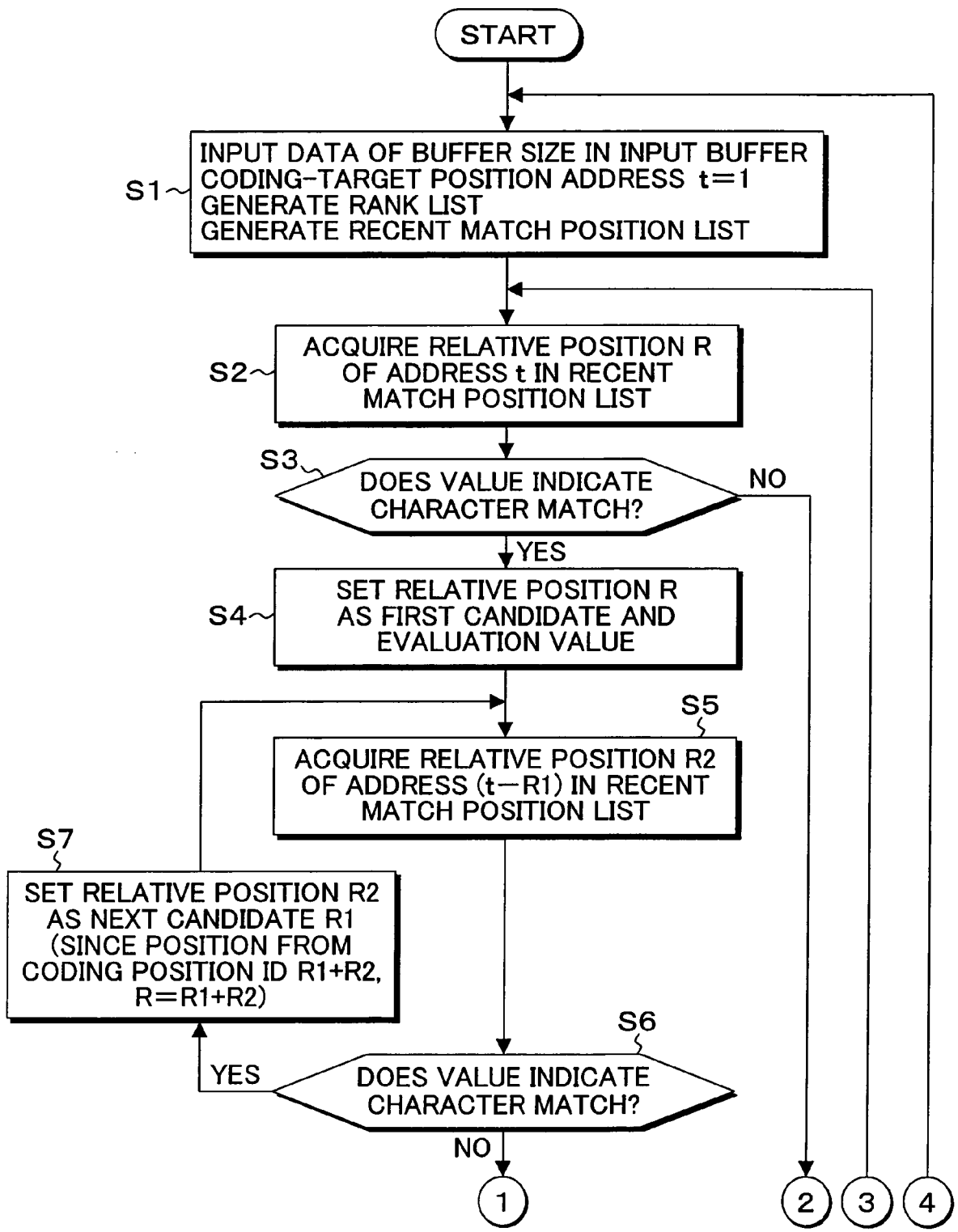
FIG. 16 is a flowchart of the data compressing process according to the third embodiment of FIGS. 15A and 15B.
Figure 17:
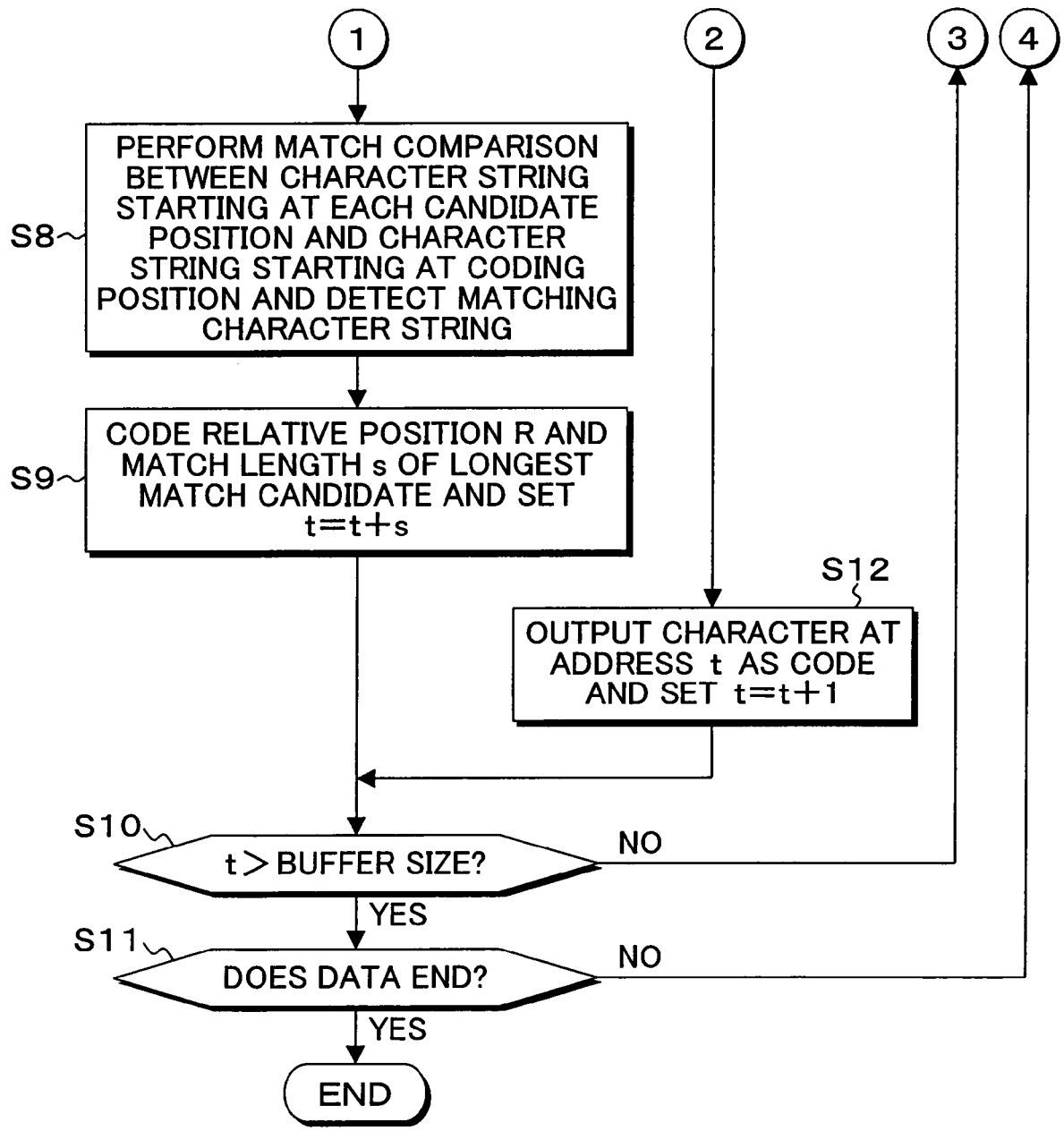
FIG. 17 is the flowchart of the data compressing process continued from FIG. 16.

FIGS. 16 and 17 are a flowchart of the data compressing process according to the third embodiment of the present invention, and the procedure goes as follows.

Step S1: Data of the buffer size is input to the input buffer, a coding-target position address t is initialized as t=1, and a rank list and a recent match position list are generated.

Step S2: A relative position Ri is acquired from the address t in the recent match position list.

Step S3: It is checked whether the value of the acquired relative position R is a value other than 0, the value being indicative of a character match. If the value is such a value, the procedure goes to step S4, and if otherwise, the procedure goes to step S12.

Step S4: The value of the relative position R1 is set as a first candidate.

Step S5: A relative position R2 from a coding position address (t−R1) is acquired.

Step S6: It is checked whether the value of the acquired relative position R is a value other than 0, the value being indicative of a character match. If the value is such value, the procedure goes to step S7, and if otherwise, the procedure goes to step S8.

Step S7: The relative position R1 is set as the next candidate R1 (since a position from the coding position is R1+R2, R1=R1+R2).

Step S8: This is the case where the value of the acquired relative value is 0 indicative of no character match. A match comparison is performed between each of the character string starting at the candidate positions and the character string starting at the coding target position, and a match length s is detected.

Step S9: After the relative position R and the match length s of the longest-match-candidate character string are coded, t=t+s is set.

Step S10: If the coding position address t becomes larger than the buffer size, the procedure goes to step S11, and if otherwise, the procedure returns to step S2.

Step S11: It is checked whether the data to be compressed ends. If the data ends, the procedure ends, and if otherwise, the procedure returns to step S1.

Step S12: This is the case where the value does not indicate a character match in step S3. The character at the address t is output as it is as a code, and with t=t+1, the procedure goes to step S10.

FIGS. 18a and 18B are illustrative diagrams of a data compressing process according to a fourth embodiment of the present invention. This fourth embodiment has a feature such that, after a character string having the longest match is acquired according to the first embodiment of FIGS. 9A and 9B, a candidate for that acquired character string is newly taken as a first candidate, that is, a so-called revised first candidate, and then the process in the third embodiment of FIGS. 15A and 15B are applied. That is, with the process in the first embodiment, a recent match portion can be found, but the process cannot be extended to the past any further. To get around this, the process in the third embodiment of FIGS. 15A and 15B capable of extending the candidate range to a previous match portion is combined.

For the fourth embodiment of FIGS. 18A and 18B, a process by the repetition candidate acquiring unit 16 of FIG. 7 are divided into a first process, which is the process in the first embodiment of FIGS. 9A and 9B, and a second process, which is the process in the third embodiment of FIGS. 15A and 15B.

(First Process)
(1) With a coding position 50 being taken as an address 11, a stored value of 4 acquired from the recent match position list 24 is taken as a first candidate for a repetition position of a character string.
(2) The stored value of the first candidate is taken as an evaluation value of 4.
(3) With positions subsequent to the coding position 50, that is, positions obtained by adding +1, +2, . . . +N, being taken as addresses 12 to 17, each of stored values of 7, 7, 3, 3, 3, and 3 acquired from the recent match position list 24 and the evaluation value of 4 are compared, and when the value is larger than the evaluation value of 4, subsequent candidates following the first candidate are taken in order of increasing distance from the coding position 50. In this example, the stored values at the addresses 12 and 13 are 7, which is larger than the evaluation value of 4, and therefore become second candidates. Here, since the stored values at the addresses 12 and 13 are both 7, the address of the second candidate is 11−7=4. For the other addresses 14 to 17, they are smaller than the evaluation value of 4, and therefore are out of candidacy.

In this manner, upon acquisition of the first candidate and the second candidate, the match detecting unit 18 of FIG. 7 performs a match comparison 60 between each of the character strings starting from the first candidate 52 at the address 7 and the second candidate 54 at the address 4 and a character string starting from the coding position 50 at the address 11, and a character string having the longest match, that is, in this case, the character string "abcabc" of the second candidate 54 from the address 4, is taken as a revised first candidate 56 for the next second process.

(Second Process)
In the second process, with an address of the revised first candidate being taken as 4−3=1, a stored value acquired from the recent match position list 24 is taken as a revised second candidate 58. Then, the code generating unit 20 of FIG. 7 compares each of the character strings starting from the address 4 of the revised first candidate 56 and the address 1 of the revised second candidate and the character string starting the address 11 of the coding position 50, and detects a character string of a candidate having the longest match. In this case, the character string of the second revised candidate 58 is a character string "abcabcabc", which has the longest match. Since the relative position of the revised second candidate is 11−1=10 and the match length is 9, coding is performed with (relative position, match length)=(10, 9).

Figure 19:
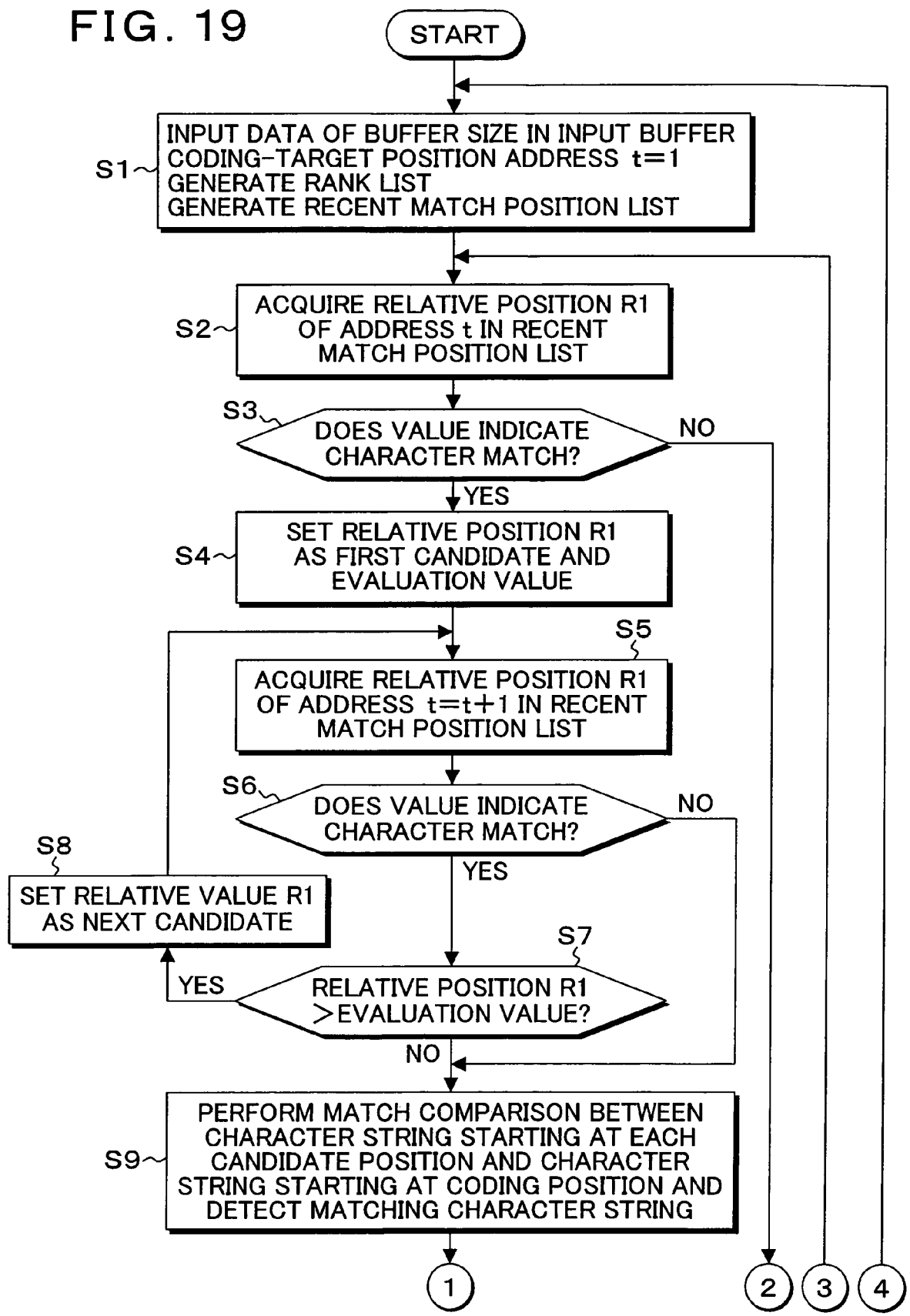
FIG. 19 is a flowchart of the data compressing process according to the fourth embodiment of FIGS. 18A and 18B.
Figure 20:
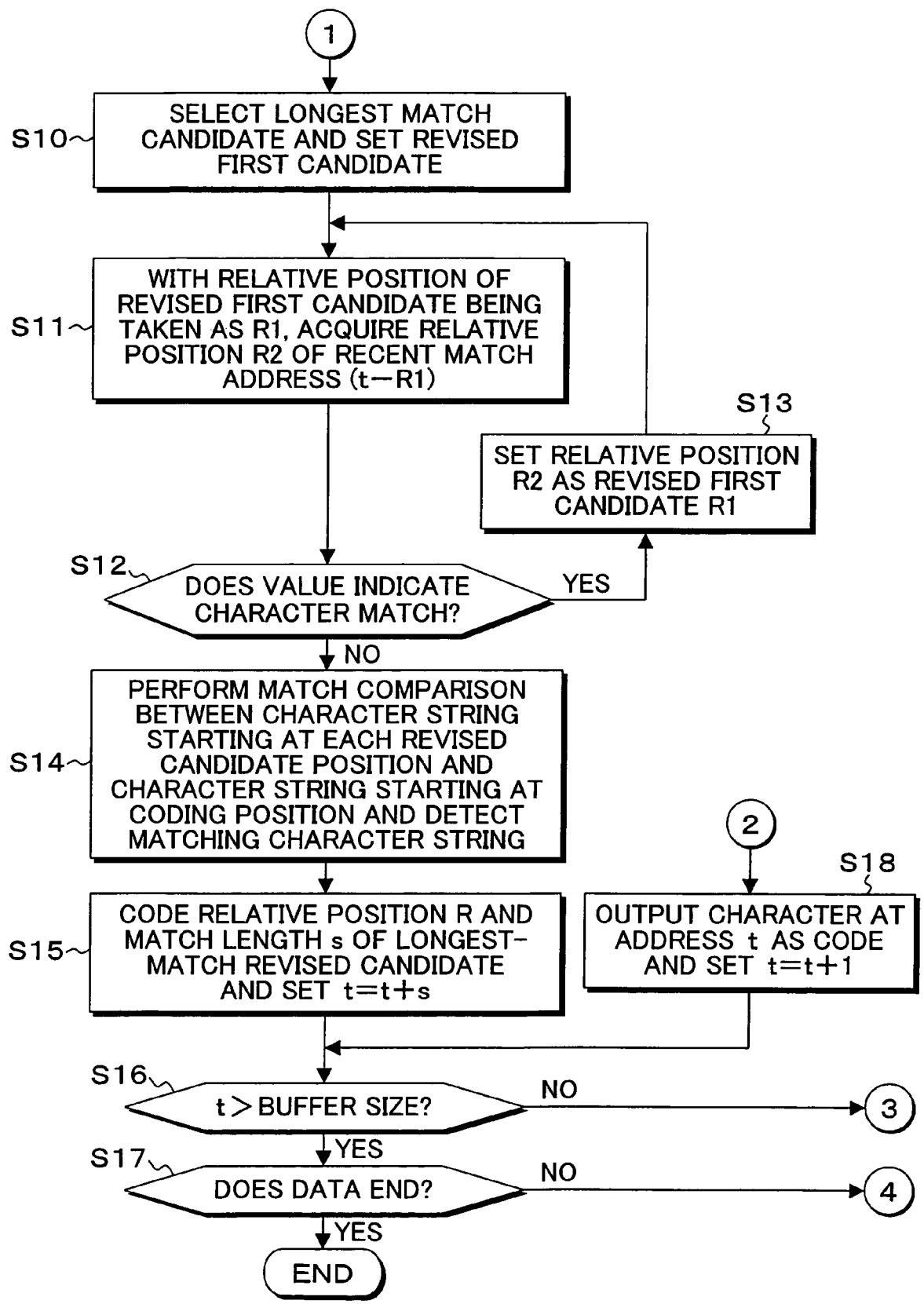
FIG. 20 is the flowchart of the data compressing process continued from FIG. 19.

FIGS. 19 and 20 are a flowchart of the data compressing process according to the fourth embodiment of the present invention, and the procedure goes as follows.

Step S1: Data of the buffer size is input to the input buffer, a coding-target position address t is initialized as t=1, and a rank list and a recent match position list are generated.

Step S2: A relative position R1 is acquired from the address t in the recent match position list.

Step S3: It is checked whether the value of the acquired relative position R1 is a value other than 0, the value being indicative of a character match. If the value is such a value, the procedure goes to step S4, and if otherwise, the procedure goes to step S18.

Step S4: The value of the relative position R1 is set as a first candidate and an evaluation value.

Step S5: A relative position R of an address t=t+1 is acquired from the coding position address t.

Step S6: It is checked whether the value of the acquired relative position R1 is a value other than 0, the value being indicative of a character match. If the value is such value, the procedure goes to step S7, and if otherwise, the procedure goes to step S9.

Step S7: It is checked whether the value of the acquire relative position R1 is larger than the evaluation value. If the value is larger, the procedure goes to step S8, and if otherwise, the procedure goes to step S9.

Step S8: The relative position R1 is set as the next candidate, and then the procedure returns to step S5.

Step S9: This is the case where the value of the acquired relative value is 0 indicative of no character match. A match comparison is performed between each of the character strings starting at the candidate positions and the character string starting at the coding target position, and a match length s is detected.

Step S10: The candidate having the longest match is selected and taken as a revised first candidate.

Step S11: With the relative position of the revised first candidate being taken as R1, a relative position R2 of an address (t−R1) in the recent match position list is acquired.

Step S12: It is checked whether the value of the acquired relative position R is a value other than 0, the value being indicative of a character match. If the value is such value, the procedure goes to step S13, and if otherwise, the procedure goes to step S14.

Step S13: The relative position R2 is set as the next revised candidate R1, and then the procedure returns to step S11.

Step S14: This is the case where the value of the relative value acquired in step S12 indicates, no character match. A match comparison is performed between each of the character strings starting at the candidate positions and the character string starting at the coding target position, and a match length s is detected.

Step S15: After the relative position R and the match length s of the longest-match-candidate character string are coded, t=t+s is set.

Step S16: If the coding position address t becomes larger than the buffer size, the procedure goes to step S17, and if otherwise, the procedure returns to step S2.

Step S17: It is checked whether the data to be compressed ends. If the data ends, the procedure ends, and if otherwise, the procedure returns to step S1.

Step S18: This is the case where the value does not indicate a character match in step S3. The character at the address t is output as it is as a code, and with t=t+1, the procedure goes to step S16.

Note that the present invention is not restricted to the above embodiments, and includes appropriate modifications without impairing objects and advantages of the present invention. Furthermore, the present invention is not restricted by the numerical values in the above embodiments.

INDUSTRIAL APPLICABILITY

As has been described in the foregoing, according to the present invention, with each character string having a predetermined length starting at each address in the input buffer, candidates for a matching character string are narrowed down with the recent match position list. For the narrowed-down candidates, a match detection is performed with the character string at the coding position to detect and coding the longest character string. Thus, even or a character string of data to be compressed in which the same numbers are not successively present in the recent match position list and therefore a match position is unclear, the longest-match character string can be detected and coded in high speed.

Also, only the input buffer and the recent match position list are used as search tables for use in coding by detection of the longest-match character string. Therefore, a data compressing function can be implemented with a small amount of memory.

The invention claimed is:

1. A data compression method that generates compressed data from a data string to be compressed, comprising:

inputting and retaining, by an input unit, the data string to be compressed in an input buffer;

generating and retaining, by a recent match position list generating unit, a recent match position list having stored therein a relative position where each character string having a predetermined length starting at each address in the input buffer has most recently appeared;

acquiring, by a repetition candidate acquiring unit, with the use of the recent match position list, a repetition candidate at a position where a character string at a coding position has previously appeared;

comparing, by a match detecting unit, a character string starting at the position of the acquired repetition candidate and the character string at the coding position, and detecting a matching character string from the position of the repetition candidate; and coding, by a code generating unit, the detected matching character string having the longest match length, wherein in the candidate acquiring unit, a stored value acquired from the recent match position list with the coding position being taken as an address is taken as a first candidate for a character string repetition position, in the match detecting unit, a character string starting at a position of the first candidate and the character string starting at the coding position are compared, and a matching character string is acquired and coded, the candidate acquiring unit further includes:

comparing, with the first candidate being taken as an evaluation value, a stored value acquired from the recent match position list and the evaluation value with each position subsequent to the coding position being taken as an address and, when the acquired store value is a value previous to the evaluation value, acquiring one or plural subsequent candidates following the first candidate in order of increasing distance from the coding position comparing each of character strings starting at the first candidate and the subsequent candidates and the character string starting at the coding position, and taking, as a revised first candidate a character string having the longest match length with respect to the character string at the coding position, and taking, as one or plural subsequent candidates following the revised first candidate, a stored value acquired from the recent match position list as revised subsequent candidates with a preceding candidate being taken as an address, and in the match detecting unit, each of character strings starting at the revised first candidate and the revised subsequent candidates and the character string starting at the coding position are compared, and a character string having the longest match length is detected and coded.

2. The data compression method according to claim 1, wherein the candidate acquiring unit further includes:

taking the first candidate as the evaluation value; and comparing the stored value acquired from the recent match position list and the evaluation value with each address subsequent to the coding position being taken as an address and, when the acquired stored value is the value previous to the evaluation value, acquiring one or a plurality of subsequent candidates in order of increasing distance from the coding position, and in the match detecting unit, each of character strings starting at the first candidate and the subsequent candidates and the character string starting at the coding position are compared, and a character string having the longest match length is acquired and coded.

3. The data compression method according to claim 2, wherein in the candidate acquiring unit, when the subsequent candidate is acquired, a value of the acquired subsequent candidate is taken as an evaluation value for acquiring a next subsequent candidate.

4. The data compression method according to claim 1, wherein the candidate acquiring unit further includes:

taking the value acquired from the recent match position list with the first candidate being taken as an address; and comparing the stored value acquired from the recent match position list and the evaluation value with each address subsequent to the coding position being taken as an address and, when the acquired stored value is a value previous to the evaluation value, acquiring one or a plurality of subsequent candidates in order of increasing distance from the coding position as, and in the match detecting unit, each of character strings starting at the first candidate and the subsequent candidates and the character string starting at the coding position are compared, and a character string having the longest match length is detected and coded.

5. The data compression method according to claim 4, wherein in the candidate acquiring unit, when the subsequent candidate is acquired, a value of the acquired subsequent candidate is taken as an evaluation value for acquiring a next subsequent candidate.

6. The data compression method according to claim 1, wherein in the candidate acquiring unit, as one or plural subsequent candidates following the first candidate, a stored value acquired from the recent match position list with a preceding candidate being taken as an address, and in the match detecting unit, each of character strings starting at the first candidate and the subsequent candidates and the character string starting at the coding position are compared, and a character string having the longest match length is acquired and coded.

7. The data compression method according to claim 1, wherein in the code generating step, the character string from the coding position is coded with a relative position and the match length of the detected matching character string.

8. A computer-readable storage medium which stores a program allowing a computer to execute:

inputting and retaining the data string to be compressed in an input buffer;

generating and retaining a recent match position list having stored therein a relative position where each character string having a predetermined length starting at each address in the input buffer has most recently appeared;

acquiring, by using the recent match position list, a repetition candidate at a position where the character string at a coding position has previously appeared;

comparing a character string starting at the position of the acquired repetition candidate and the character string starting at the coding position, and acquiring a matching character string from the position of the repetition candidate; and coding the detected matching character string having the longest match length, wherein in the candidate acquiring unit, a stored value acquired from the recent match position list with the coding position being taken as an address is taken as a first candidate for a character string repetition position, in the match detecting unit, a character string starting at a position of the first candidate and the character string starting at the coding position are compared, and a matching character string is acquired and coded, the candidate acquiring unit further includes:

comparing, with the first candidate being taken as an evaluation value, a stored value acquired from the recent match position list and the evaluation value with each position subsequent to the coding position being taken as an address and, when the acquired store value is a value previous to the evaluation value, acquiring one or plural subsequent candidates following the first candidate in order of increasing distance from the coding position comparing each of character strings starting at the first candidate and the subsequent candidates and the character string starting at the coding position, and taking, as a revised first candidate a character string having the longest match length with respect to the character string at the coding position, and taking, as one or plural subsequent candidates following the revised first candidate, a stored value acquired from the recent match position list as revised subsequent candidates with a preceding candidate being taken as an address, and in the match detecting unit, each of character strings starting at the revised first candidate and the revised subsequent candidates and the character string starting at the coding position are compared, and a character string having the longest match length is detected and coded.

9. The storage medium according to claim 8, wherein the candidate acquiring unit further includes:

taking the first candidate as the evaluation value; and comparing the stored value acquired from the recent match position list and the evaluation value with each address subsequent to the coding position being taken as the address and, when the acquired stored value is a value previous to the evaluation value, acquiring one or a plurality of subsequent candidates in order of increasing distance from the coding position, and in the match detecting unit, each of character strings starting at the first candidate and the subsequent candidates and the character string starting at the coding position are compared, and a character string having the longest match length is acquired and coded.

10. The storage medium according to claim 9, wherein in the candidate acquiring unit, when the subsequent candidate is acquired, a value of the acquired subsequent candidate is taken as an evaluation value for acquiring a next subsequent candidate.

11. The storage medium according to claim 8, wherein the candidate acquiring unit further includes:

taking a value acquired from the recent match position list with the first candidate being taken as an address; and comparing a stored value acquired from the recent match position list and the evaluation value with each address subsequent to the coding position being taken as an address and, when the acquired stored value is a value previous to the evaluation value, acquiring one or a plurality of subsequent candidates in order of increasing distance from the coding position as, and in the match detecting unit, each of character strings starting at the first candidate and the subsequent candidates and the character string starting at the coding position are compared, and a character string having the longest match length is detected and coded.

12. The storage medium according to claim 11, wherein in the candidate acquiring step, when the subsequent candidate is acquired, a value of the acquired subsequent candidate is taken as an evaluation value for acquiring a next subsequent candidate.

13. The storage medium according to claim 8, wherein in the candidate acquiring unit, as one or plural subsequent candidates following the first candidate, a stored value acquired from the recent match position list with a preceding candidate being taken as an address, and in the match detecting unit, each of character strings starting at the first candidate and the subsequent candidates and the character string starting at the coding position are compared, and a character string having the longest match length is acquired and coded.

14. The storage medium according to claim 8, wherein in the code generating unit, the character string from the coding position is coded with a relative position and the match length of the detected matching character string.

15. A computer having a data compression apparatus that generates compressed data from a data string to be compressed, comprising:

an input buffer that inputs and retains, in the input buffer, a data string to be compressed;

a recent match position list generating unit that generates and retains a recent match position list having stored therein a relative position where each character string having a predetermined length starting at each address in an input buffer has most recently appeared;

a candidate acquiring unit that acquires, by using the recent match position list, a repetition candidate at a position where the character string at the coding position has previously appeared;

a match detecting unit that compares a character string starting at the position of the acquired repetition candidate and the character string starting at the coding position, and detecting a matching character string from the repetition candidate; and a code generating unit that codes the detected matching character string having the longest match length, wherein the candidate acquiring unit takes a stored value acquired from the recent match position list with the coding position being taken as an address as a first candidate for a character string repetition position, the match detecting unit compares a character string starting at a position of the first candidate and the character string starting at the coding position, and a matching character string is acquired and coded, the candidate acquiring unit further:

compares, with the first candidate being taken as an evaluation value, a stored value acquired from the recent match position list and the evaluation value with each position subsequent to the coding position being taken as an address and, when the acquired store value is a value previous to the evaluation value, acquiring one or plural subsequent candidates following the first candidate in order of increasing distance from the coding position comparing each of character strings starting at the first candidate and the subsequent candidates and the character string starting at the coding position, and taking, as a revised first candidate a character string having the longest match length with respect to the character string at the coding position; and takes, as one or plural subsequent candidates following the revised first candidate, a stored value acquired from the recent match position list as revised subsequent candidates with a preceding candidate being taken as an address, and the match detecting unit each of character strings starting at the revised first candidate and the revised subsequent candidates and the character string starting at the coding position are compared, and a character string having the longest match length is detected and coded.

* * * * *